(12) United States Patent
Auman et al.

(10) Patent No.: US 8,653,512 B2
(45) Date of Patent: Feb. 18, 2014

(54) THIN FILM TRANSISTOR COMPOSITIONS, AND METHODS RELATING THERETO

(75) Inventors: Brian C. Auman, Avondale, PA (US); Meredith L. Dunbar, Canal Winchester, OH (US); Tao He, Wilmington, DE (US); Kostantinos Kourtakis, Media, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/510,628

(22) PCT Filed: Nov. 19, 2010

(86) PCT No.: PCT/US2010/057388
§ 371 (c)(1),
(2), (4) Date: May 18, 2012

(87) PCT Pub. No.: WO2011/063209
PCT Pub. Date: May 26, 2011

(65) Prior Publication Data
US 2012/0228616 A1    Sep. 13, 2012

Related U.S. Application Data

(60) Provisional application No. 61/263,266, filed on Nov. 20, 2009.

(51) Int. Cl.
*H01L 29/08* (2006.01)

(52) U.S. Cl.
USPC .................. 257/40; 257/57; 257/E29.289

(58) Field of Classification Search
USPC ........ 257/57, 347, E29.117, 40, 59; 438/149, 438/151, 146, 155
See application file for complete search history.

(56) References Cited

U.S. PATENT DOCUMENTS

| | | |
|---|---|---|
| 3,179,634 A | 4/1965 | Edwards |
| 3,287,311 A | 11/1966 | Edwards |
| 4,522,958 A | 6/1985 | Das et al. |
| 4,742,099 A | 5/1988 | Nagano et al. |
| 4,792,476 A | 12/1988 | Numata et al. |

(Continued)

FOREIGN PATENT DOCUMENTS

| | | |
|---|---|---|
| CN | 1215741 A | 5/1999 |
| CN | 1676548 A | 10/2005 |

(Continued)

OTHER PUBLICATIONS

International Search Report PCT/US2009/44283 filed on May 18, 2009.

(Continued)

*Primary Examiner* — Bilkis Jahan

(57) ABSTRACT

The present disclosure is directed to a thin film transistor composition. The thin film transistor composition has a semiconductor material and a substrate. The substrate is composed of a polyimide and a sub-micron filler. The polyimide is derived from at least one aromatic dianhydride component selected from rigid rod dianhydride, non-rigid rod dianhydride and combinations thereof, and at least one aromatic diamine component selected from rigid rod diamine, non-rigid rod diamine and combinations thereof. The mole ratio of dianhydride to diamine is 48-52:52-48 and the ratio of X:Y is 20-80:80-20 where X is the mole percent of rigid rod dianhydride and rigid rod diamine, and Y is the mole percent of non-rigid rod dianhydride and non-rigid rod diamine. The sub-micron filler is less than 550 nanometers in at least one dimension; has an aspect ratio greater than 3:1; is less than the thickness of the film in all dimensions.

23 Claims, 1 Drawing Sheet

(56) References Cited

U.S. PATENT DOCUMENTS

| | | | |
|---|---|---|---|
| 4,886,874 A | 12/1989 | Nagano et al. | |
| 5,148,265 A | 9/1992 | Khandros et al. | |
| 5,148,266 A | 9/1992 | Khandros et al. | |
| 5,166,308 A * | 11/1992 | Kreuz et al. | 528/188 |
| 5,436,204 A | 7/1995 | Albin et al. | |
| 5,441,897 A | 8/1995 | Noufi et al. | |
| 5,489,749 A | 2/1996 | Di Stefano et al. | |
| 5,536,909 A | 7/1996 | Di Stefano et al. | |
| 5,648,407 A | 7/1997 | Goetz et al. | |
| 5,821,608 A | 10/1998 | Di Stefano et al. | |
| 5,837,767 A | 11/1998 | Shimokusuzuno et al. | |
| 5,930,026 A | 7/1999 | Jacobson et al. | |
| 5,961,804 A | 10/1999 | Jacobson et al. | |
| 6,017,584 A | 1/2000 | Albert et al. | |
| 6,067,185 A | 5/2000 | Albert et al. | |
| 6,118,426 A | 9/2000 | Albert et al. | |
| 6,120,588 A | 9/2000 | Jacobson et al. | |
| 6,120,839 A | 9/2000 | Comiskey et al. | |
| 6,124,851 A | 9/2000 | Jacobson et al. | |
| 6,130,773 A | 10/2000 | Jacobson et al. | |
| 6,130,774 A | 10/2000 | Albert et al. | |
| 6,172,798 B1 | 1/2001 | Albert et al. | |
| 6,207,739 B1 | 3/2001 | Ono et al. | |
| 6,362,433 B1 * | 3/2002 | Takahashi et al. | 174/255 |
| 6,372,538 B1 | 4/2002 | Wendt et al. | |
| 6,620,339 B1 * | 9/2003 | Shimizu et al. | 252/299.66 |
| 6,770,981 B2 | 8/2004 | Jiang et al. | |
| 6,825,068 B2 | 11/2004 | Denis et al. | |
| 7,271,333 B2 | 9/2007 | Fabick et al. | |
| 7,365,394 B2 * | 4/2008 | Denis et al. | 257/347 |
| 7,579,134 B2 * | 8/2009 | Dueber et al. | 430/283.1 |
| 2003/0153099 A1 | 8/2003 | Jiang | |
| 2004/0126600 A1 * | 7/2004 | Dunbar et al. | 428/473.5 |
| 2005/0067656 A1 * | 3/2005 | Denis et al. | 257/347 |
| 2005/0067657 A1 * | 3/2005 | Tanaka | 257/355 |
| 2005/0072461 A1 | 4/2005 | Kuchinski et al. | |
| 2005/0163968 A1 | 7/2005 | Hanket | |
| 2005/0272907 A1 * | 12/2005 | Jin et al. | 528/310 |
| 2006/0037641 A1 | 2/2006 | Kibbel et al. | |
| 2006/0083939 A1 * | 4/2006 | Dunbar et al. | 428/473.5 |
| 2007/0044834 A1 | 3/2007 | Berke et al. | |
| 2008/0044682 A1 | 2/2008 | Chan et al. | |
| 2009/0197104 A1 * | 8/2009 | Chen et al. | 428/458 |
| 2009/0288699 A1 | 11/2009 | Auman et al. | |
| 2010/0003791 A1 * | 1/2010 | Maeda et al. | 438/158 |
| 2010/0048861 A1 * | 2/2010 | Jung et al. | 528/347 |
| 2010/0279045 A1 | 11/2010 | Nakajima et al. | |
| 2011/0079277 A1 * | 4/2011 | Shimokawa et al. | 136/255 |

FOREIGN PATENT DOCUMENTS

| | | |
|---|---|---|
| DE | 102006016307 A1 | 10/2007 |
| EP | 586181 A2 | 3/1994 |
| EP | 586181 A3 | 3/1994 |
| EP | 1168436 A2 | 1/2002 |
| EP | 1447214 A1 | 8/2004 |
| EP | 1672009 A1 | 6/2006 |
| JP | 63/312328 A | 10/1988 |
| JP | 1055120 A | 2/1998 |
| JP | 2001/233611 A | 8/2001 |
| JP | 2002/079616 A | 3/2002 |
| JP | 2003/082231 A | 3/2003 |
| JP | 2004/035825 A | 2/2004 |
| JP | 2004059694 A | 2/2004 |
| JP | 2006028216 A | 2/2006 |
| WO | 02/44291 A2 | 6/2002 |
| WO | 02102882 A1 | 12/2002 |
| WO | 2006/025684 A1 | 3/2006 |
| WO | 2007/002110 A2 | 1/2007 |
| WO | 2009/142938 A1 | 11/2009 |
| WO | PCT/US10/57423 | 11/2010 |

OTHER PUBLICATIONS

International Search Report PCT/US2009/43441 filed on Nov. 5, 2009.
US2011/121296.
US2011/120545.
US2011/123796.
U.S. Appl. No. 12/623,212, filed Nov. 20, 2009, Auman et al.
U.S. Appl. No. 12/623,195, filed Nov. 20, 2009, Auman et al.
U.S. Appl. No. 12/466,033, filed May 14, 2010, Auman et al.
U.S. Appl. No. 12/883,806, filed Sep. 16, 2010, Kourtakis et al.
U.S. Appl. No. 12/991,203, filed May 18, 2009, Auman et al.
U.S. Appl. No. 61/054,505, filed May 20, 2008, Auman et al.
U.S. Appl. No. 61/054,509, filed May 20, 2008, Auman et al.
U.S. Appl. No. 61/243,404, filed Sep. 17, 2009, Kourtakis et al.
U.S. Appl. No. 12/622,789, filed Nov. 20, 2009, Auman et al.
U.S. Appl. No. 61/263,266, filed Nov. 20, 2009, Dunbar et al.
Kessler, F., Herrmann, D., Powealla, M., "Approaches to flexible CIGS thin-film solar cells", Thin Solid Films 480-481, (2005), pp. 491-498.
Khalil, Muhammad, Saeed, Shaukat, Ahmad, Zahoor, "Mechanical and Therman Properties of Polyimide/Silica Hybrids with Imide-Modified Silica Network Structures", Journal of Applied Polymer Science, vol. 107, pp. 1257-1268 (2008).
Leu, Chyi-Ming, Wu, Zhen-Wei, and Wei Kung-Hwa, "Synthesis and Properties of Covalently Bonded Layered Silicates/Polyimide (BTDA-ODA) Nanocomposites", Chem. Mater. , 2002, vol. 14, pp. 3016-3021.
Li, Lin and Chung, D.D.L., "Thermally Conducting Polymer-Matrix Composites Containing Both AlN Particles and SiC Whiskers", Journal of Electronic Materials, vol. 23, No. 6, pp. 557-564, 1994.
Research Disclosure Database No. 405061, "Low-color pigmented polyimide film", Research Disclosure Journal, ISSN 0374-4353, Published in Jan. 1998.
Romeo, A. et al, "High-Efficiency flexible CdTe solar cells on polymer substrates", Solar Energy Materials & Solar Cell, vol. 90, (2006), pp. 3407-3415.
Sarma, K.R., et al, Active Matrix OLED Using 150C a-Si TFT Backplane Built on Flexible Plastic Substrate, SPIE Proc. vol. 5080, paper 24 (2003).
Shimokusuzono, Takumi, "Polyimide Compositions for Copying Machine Paper Separation Apparatus" NTN Toyo Bearing Co., Ltd., Japan, Abstract.
Son, Minsoo et al, "Organic/Inorganic Hybrid Composite Films from Polyimide and Organosilica: Effect of the Type of Organosilica Precursors", Polymer Bulletin vol. 60, pp. 713-723 (2008).
Zhou, H.R., et al, "Synthesis and characterisation of nano-alumina hybrid polyimide films", Pigment & Resin Technology, pp. 161-166, 2008.
Zixue, Qui and Feifeng, He, "Polyimide Composites Reinforced with Whiskers", High Performance Polymers, vol. 13 (2001), pp. S343-S350.
International Search Report PCT/US2009/44285 filed on May 18, 2009.
International Search Report PCT/US2009/43439 filed on May 11, 2009.
International Search Report PCT/US2010/57397 filed on Apr. 21, 2011.
International Search Report PCT/US2010/57423 filed on Apr. 19, 2011.
International Search Report PCT/US2010/57434 fled on Apr. 19, 2011.
International Search Report PCT/US2010/57452 filed on Aug. 4, 2011.
International Search Report PCT/US2010/57379 filed on Apr. 19, 2011.
Chen, Yan and Iroh, Jude O., "Synthesis and Characterization of Polyimide/Silica Hybrid Composites", Chem. Mater. 1999, vol. 11, pp. 1218-1222.
Gleskova, H. and Wagner, S., "Failure resistance of amorphous silicon transistors under extreme iin-plane strain", Applied Physics Letters, vol. 75, No. 19, pp. 3011-3013, Nov. 8, 1999.

(56) References Cited

OTHER PUBLICATIONS

Gleskova, H. and Wagner, S., Suo, Z., "A-Si:H TFTs Made on Polyimide Foil by PE-CVD at 1500C", Mat. Res. Soc. Symp. Proc., vol. 508, pp. 73-78, 1998.

Hsu, Shou-Chian et al, "Effect of the Polyimide Structure and ZnO Concentration on the Morphology and Characteristics of Polyimide/ZnO Nanohybrid Films", Macromol. Chem. Phys., vol. 206, pp. 291-298, 2005.

* cited by examiner

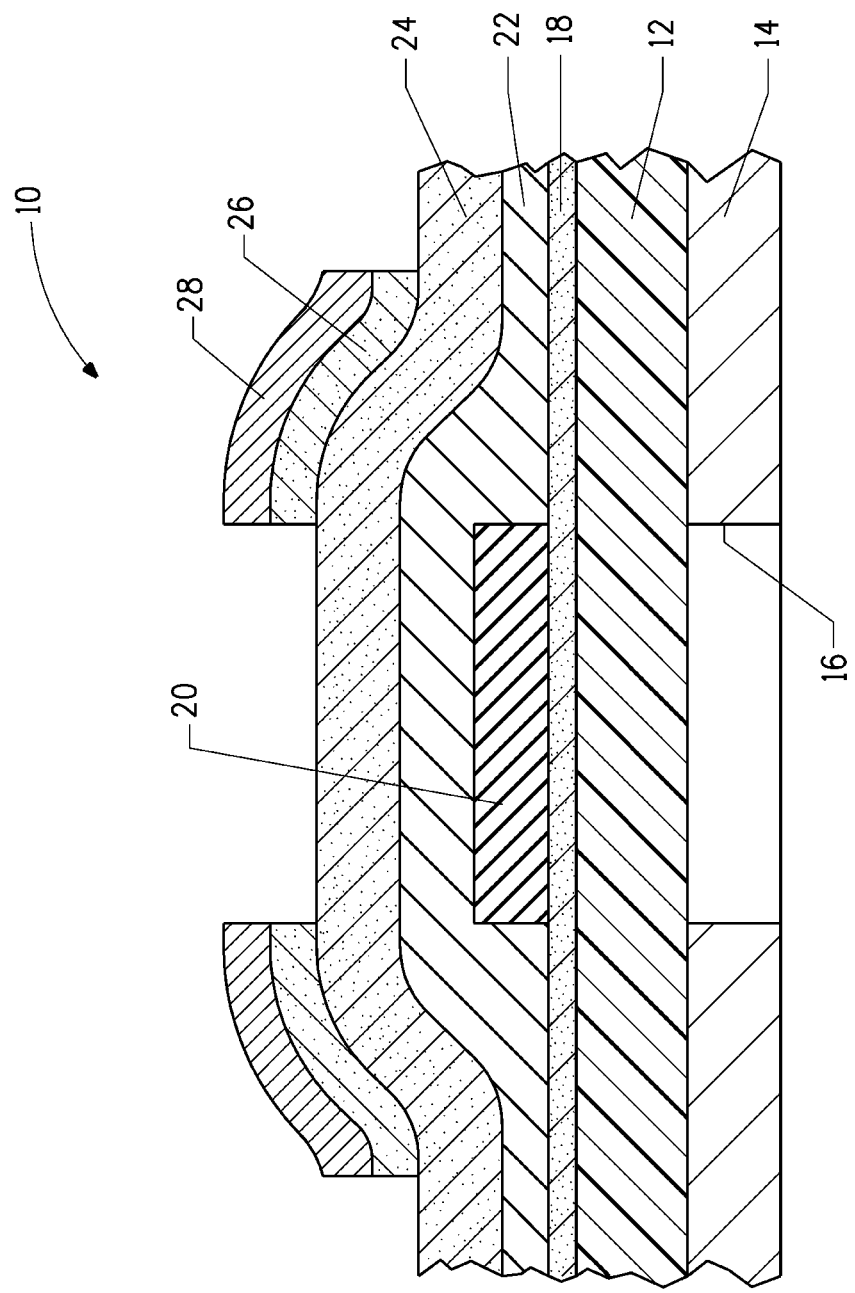

US 8,653,512 B2

THIN FILM TRANSISTOR COMPOSITIONS, AND METHODS RELATING THERETO

FIELD OF DISCLOSURE

The field of this disclosure is films useful in the manufacture of thin film transistor ("TFT") arrays, such as, TFT arrays used in the manufacture of active matrix, liquid crystal display devices.

BACKGROUND OF THE DISCLOSURE

Broadly speaking, thin film transistors (TFT's) are known. TFTs are useful in controlling various types of display, e.g., liquid crystal or electrophoretic displays and the like. Generally speaking, TFT's are commonly fabricated on rigid substrates, such as, glass. However, there is increasing interest in fabricating TFT's on flexible substrates, especially flexible polymeric films, due to lower weight and improved ruggedness (relative to glass).

Polymeric films generally do not have sufficient thermal or dimensional stability for such TFT applications. Hence, there is an ever increasing interest in the industry to find a polymer substrate that can act as a substitute for glass in a TFT application, particularly where the polymeric substrate is able to lower overall cost, improve performance, decrease weight, increase ruggedness and simplify manufacture. U.S. Pat. No. 6,825,068 to Denis, et al. is directed to semiconductor composites where semiconductive amorphous silicon is fabricated on substrates comprising polyphenylene polyimides.

SUMMARY OF THE INVENTION

The present disclosure is directed to thin film transistor compositions comprising a semiconductor material and a substrate. The substrate having a first surface on the side of the substrate closest to the semiconductor material and a second surface on the other side of the substrate. The substrate has a thickness from 5 to 150 microns and comprises a polyimide derived from:

i) at least one aromatic dianhydride component selected from the group consisting of rigid rod dianhydride, non-rigid rod dianhydride and combinations thereof, and ii) at least one aromatic diamine component selected from the group consisting of rigid rod diamine, non-rigid rod diamine and combinations thereof;

The mole ratio of dianhydride to diamine is 48-52:52-48 and the ratio of X:Y is 20-80:80-20 where X is the mole percent of rigid rod dianhydride and rigid rod diamine, and Y is the mole percent of non-rigid rod dianhydride and non-rigid rod diamine based upon the total dianhydride component and total diamine component of the polyimide; and The substrate also comprises a sub-micron filler that is less than 550 nanometers (as a numerical average) in at least one dimension, has an aspect ratio greater than 3:1, is less than the thickness of the substrate in all dimensions, and is present in an amount from 10 to 45 volume percent of the substrate.

BRIEF DESCRIPTION OF THE DRAWING

The FIG. 1 is a schematic cross-section through a single transistor of a thin film transistor array formed on a polyimide substrate of the present disclosure.

DETAILED DESCRIPTION OF THE PREFERRED EMBODIMENT(S)

Definitions

"Film" is intended to mean a free-standing film or a (self-supporting or non self-supporting) coating. The term "film" is used interchangeably with the term "layer" and refers to covering a desired area.

"Semiconductor" is intended to mean any semiconductive material, particularly amorphous silicon, but also including any of the following:

1. Group IV semiconductors (silicon, germanium, diamond);
2. Group IV compound semiconductors (SiGe, SiC);
3. Group III-V semiconductors (AlSb, AlAs, AlN, AlP, BN, BP, BAs, GaSb, GaAs, GaN, GaP, InSb, InAs, InN, InP);
4. Group III-V semiconductor alloys (AlGaAs, InGaAs, InGaP, AlInAs, AlInAs, AlInSb, GaAsN, GaAsP, AlGaN, AlGaP, InGaN, InAsSb, InGaSb);
5. III-V quaternary semiconductor alloys (AlGaInP, AlGaAsP, InGaAsP, InGaAsP, AlInAsP, AlGaAsN, InGaAsN, InAlAsN, GaAsSbN);
6. III-V quinary semiconductor alloys (GaInNAsSb, GaInAsSbP):
7. II-VI semiconductors (CdSe, CdS, CdTe, ZnO, ZnSe, ZnS, ZnTe);
8. II-VI ternary alloy semiconductors (CdZnTe, HgCdTe, HgZnTe, HgZnSe);
9. I-VII semiconductors (CuCl);
10. IV-VI semiconductors (PbSe, PbS, PbTe, SnS, SnTe);
11. IV-VI ternary semiconductors (PbSnTe, $Tl_2SnTe_5$, $Tl_2GeTe_5$);
12. V-VI semiconductors ($Bi_2Te_3$);
13. II-V semiconductors ($Cd_3P_2$, $Cd_3As_2$, $Cd_3Sb_2$, $Zn_3P_2$, $Zn_3As_2$, $Zn_3Sb_2$);
14. layered semiconductors ($PbI_2$, $MoS_2$, GaSe, SnS, $Bi_2S_3$);
15. others (CIGS, PtSi, $BiI_3$, $HgI_2$, TlBr);
16. and the like.

"Dianhydride" as used herein is intended to include precursors or derivatives thereof, which may not technically be a dianhydride but would nevertheless functionally equivalent due to the capability of reacting with a diamine to form a polyamic acid which in turn could be converted into a polyimide.

"Diamine" as used herein is intended to include precursors or derivatives thereof, which may not technically be diamines but are nevertheless functionally equivalent due to the capability of reacting with a dianhydride to form a polyamic acid which in turn could be converted into a polyimide.

"Polyamic acid" as used herein is intended to include any polyimide precursor material derived from a combination of dianhydride and diamine monomers or functional equivalents thereof and capable of conversion to a polyimide.

"Sub-micron" is intended to describe particles having (as a numerical average) at least one dimension that is less than a micron.

"Chemical conversion" or "chemically converted" as used herein denotes the use of a catalyst (accelerator) or dehydrating agent (or both) to convert the polyamic acid to polyimide and is intended to include a partially chemically converted polyimide which is then dried at elevated temperatures to a solids level greater than 98%.

"Aspect ratio" is intended to mean a ratio of one dimension to another, such as a ratio of length to height.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers, unless the context indicates or implies otherwise.

As used herein, the terms "comprises," "comprising," "includes," "including," "has," "having" or any other variation thereof, are intended to cover a non-exclusive inclusion. For Example, a method, process, article, or apparatus that comprises a list of elements is not necessarily limited to only those elements but may include other elements not expressly listed or inherent to such method, process, article, or apparatus. Further, unless expressly stated to the contrary, "or" refers to an inclusive or and not to an exclusive or. For Example, a condition A or B is satisfied by any one of the following: A is true (or present) and B is false (or not present), A is false (or not present) and B is true (or present), and both A and B are true (or present).

Also, articles "a" or "an" are employed to describe elements and components of the invention. This is done merely for convenience and to give a general sense of the invention. This description should be read to include one or at least one and the singular also includes the plural unless it is obvious that it is meant otherwise.

Overview

The thin film transistor compositions of the present disclosure have a semiconducting material and a substrate (support film). The substrate of the present disclosure comprises a polyimide and a sub-micron filler. The sub-micron filler of the present disclosure can generally be incorporated into the substrate at relatively high loadings without causing the substrate to be unduly brittle while maintaining or decreasing coefficient of thermal expansion and increasing storage modulus. Substrates of the present disclosure are useful in electronics or electrical applications, particularly as substrates for supporting metalized circuitry. The polyimide has a hybrid backbone structure comprising rigid rod portions and non-rigid rod portions.

Polyimide

The polyimides of the present disclosure are derived from the polymerization reaction of certain aromatic dianhydrides with certain aromatic diamines to provide a polymeric backbone structure that comprises both rigid rod portions and non-rigid rod portions. The rigid rod portions arise from the polymerization of aromatic rigid rod monomers into the polyimide, and the non-rigid rod portions arise from the polymerization of non-rigid rod aromatic monomers into the polyimide. Aromatic rigid rod monomers give a co-linear (about 180°) configuration to the polymer backbone, and therefore relatively little movement capability, when polymerized into a polyimide.

Examples of aromatic rigid rod diamine monomers are:
1,4-diaminobenzene (PPD),
4,4'-diaminobiphenyl,
2,2'-bis(trifluoromethyl) 4,4'-diaminobiphenyl (TFMB),
1,4-naphthalenediamine,
1,5-naphthalenediamine,
4,4''-diamino terphenyl,
4,4'-diamino benzanilide
4,4'-diaminophenyl benzoate,
3,3'-dimethyl-4,4'-diaminobiphenyl,
2,5-diaminotoluene and the like.

Examples of aromatic rigid rod dianhydride monomers are:
pyromellitic dianhydride (PMDA),
2,3,6,7-naphthalenetetracarboxylic dianhydride, and
3,3',4,4'-biphenyl tetracarboxylic dianhydride (BPDA).

Monomers having a freedom of rotational movement or bending (once polymerized into a polyimide) substantially equal to or less than the above Examples (of rigid rod diamines and rigid rod dianhydrides) are intended to be deemed rigid rod monomers for purposes of this disclosure.

Non-rigid rod monomers for purposes of this disclosure are intended to mean aromatic monomers capable of polymerizing into a polyimide backbone structure having substantially greater freedom of movement compared to the rigid rod monomers described and exemplified above. The non rigid rod monomers, when polymerized into a polyimide, provide a backbone structure having a bend or otherwise are not co-linear along the polyimide backbone they create (e.g., are not about 180°). Examples of non-rigid rod monomers in accordance with the present disclosure include any diamine and any dianhydride capable of providing a rotational or bending bridging group along the polyimide backbone. Examples of rotational or bending bridging groups include —O—, —S—, —$SO_2$—, —C(O)—, —$(CH_3)_2$—, —$C(CF_3)_2$—, and —(R,R')— where R and R' are the same or different and are any organic group capable of bonding to a carbon.

Examples of non-rigid rod diamines include: 4,4'-diaminodiphenyl ether ("ODA"), 2,2-bis-(4-aminophenyl) propane, 1,3-diaminobezene (MPD), 4,4'-diaminobenzophenone, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl) methylamine, m-amino benzoyl-p-amino anilide, 4-aminophenyl-3-aminobenzoate, N,N-bis-(4-aminophenyl) aniline, 2,4-diaminotoluene, 2,6-diaminotoluene, 2,4-diamine-5-chlorotoluene, 2,4-diamino-6-chlorotoluene, 2,4-bis-(beta-amino-t-butyl) toluene, bis-(p-beta-amino-t-butyl phenyl) ether, p-bis-2-(2-methyl-4-aminopentyl)benzene, m-xylylene diamine, p-xylylene diamine. 1,2-bis-(4-aminophenoxy)benzene, 1,3-bis-(4-aminophenoxy)benzene, 1,2-bis-(3-aminophenoxy)benzene, 1,3-bis-(3-aminophenoxy)benzene, 1-(4-aminophenoxy)-3-(3-aminophenoxy) benzene, 1,4-bis-(4-aminophenoxy)benzene, 1,4-bis-(3-aminophenoxy)benzene, 1-(4-aminophenoxy)-4-(3-aminophenoxy)benzene, 2,2-bis-(4-[4-aminophenoxy] phenyl) propane (BAPP), 2,2'-bis-(4-aminophenyl)-hexafluoro propane (6F diamine), 2,2'-bis-(4-phenoxy aniline) isopropylidene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl)benzene amine], 4,4'-thio-bis-[(2-trifluoromethyl)benzene-amine], 4,4'-thiobis[(3-trifluoromethyl)benzene amine], 4,4'-sulfoxyl-bis-[(2-trifluoromethyl)benzene amine], 4,4'-sulfoxyl-bis-[(3- trifluoromethyl)benzene amine], and 4,4'-keto-bis-[(2-trifluoromethyl)benzene amine].

Examples of non-rigid rod aromatic dianhydrides include 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 2,3,3',4'-biphenyl tetracarboxylic dianhydride, 4,4'-thio-diphthalic anhydride, bis(3,4-dicarboxyphenyl) sulfone dianhydride (DSDA), bis (3,4-dicarboxyphenyl) sulfoxide dianhydride, 4,4'-oxydiphthalic anhydride (ODPA), bis(3,4-dicarboxyphenyl) thio ether dianhydride, 2,2-Bis[4-(3,4-dicarboxyphenoxy)phenyl]propane dianhydride (BPADA), bisphenol S dianhydride, 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, bis(3,4-dicarboxyphenyl) methane dianhydride, cyclopentadienyl tetracarboxylic acid dianhydride, ethylene tetracarboxylic acid dianhydride, 2,2-bis(3,4-dicarboxyphenyl) propane dianhydride.

In some embodiments, the mole ratio of dianhydride to diamine is 48-52:52-48 and the ratio of X:Y is 20-80:80-20 where X is the mole percent of rigid rod dianhydride and rigid rod diamine, and Y is the mole percent of non-rigid rod dianhydride and non-rigid rod diamine based upon the total dianhydride component and diamine component of the polyimide. And in alternative embodiments can be any sub-range within that broad ratio (e.g., 20-80 includes any range between and optionally including 20, 25, 30, 35, 40, 45, 50, 55, 60, 65, 70, 75 and 80, and 80-20 includes any range between and optionally including 80, 75, 70, 65, 60, 55, 45, 40, 35, 30, and 25).

In one embodiment, the polyimide of the present disclosure is derived from substantially equal molar amounts of 4,4'-diaminodiphenyl ether (4,4'-ODA) non-rigid rod monomer, and pyromellitic dianhydride (PMDA), rigid rod monomer. In another embodiment, at least 70 mole percent of the aromatic dianhydride component is pyromellitic dianhydride; and at least 70 mole percent of the aromatic diamine component is 4,4'-diaminodiphenyl ether. In some embodiments, at least 70, 75, 80, 85, 90 or 95 mole percent of the aromatic dianhydride component is pyromellitic dianhydride (based upon total dianydride content of the polyimide); and at least 70, 75, 80, 85, 90 or 95 mole percent of the aromatic diamine component is 4,4'-diaminodiphenyl ether (based upon total diamine content of the polyimide). Such PMDA//4,4'ODA polyimides have been found to be particularly well suited for combination with the sub-micron fillers of the present disclosure, for improved properties at a relatively low cost. In another embodiment, the polyimide is derived from 100 mole percent pyromellitic dianhydride and 100 mole percent 4,4'-diaminodiphenyl ether. In another embodiment, the polyimide is a random copolymer derived from 4,4'-diaminodiphenyl ether and 1,4 diaminobenzene with pyromellitic dianhydride and 3,3',4,4'-biphenyl tetracarboxylic dianhydride. In yet another embodiment, the polyimide is a random copolymer derived from 4,4'-diaminodiphenyl ether and 1,4 diaminobenzene with pyromellitic dianhydride.

In another embodiment, at least 75 mole percent of the aromatic dianhydride component is pyromellitic dianhydride and 70 mole percent 4,4'-diaminodiphenyl ether and 30 mole percent 1,4 diaminobenzene as the aromatic diamine component.

In another embodiment, the polyimide is a block copolymer. A block copolymer is a polymer in which there are sequences of substantially one dianhydride/diamine combination along the polymer backbone as opposed to a completely random distribution of monomer sequences. Typically this is achieved by sequential addition of different monomers during the polyamic acid preparation.

In yet another embodiment, the polyimide is block copolymer derived from 4,4'-diaminodiphenyl ether and 1,4-diaminobenzene with pyromellitic dianhydride. In yet another embodiment, the polyimide is a block copolymer is derived from 4,4'-diaminodiphenyl ether (4,4'-ODA) and 1,4-diaminobenzene (PPD) with pyromellitic dianhydride (PMDA) and 3,3',4,4'-biphenyl tetracarboxylic dianhydride (BPDA). In yet another embodiment, the polyimide is a block copolymer consisting of substantially rigid blocks (PMDA reacted with PPD) and substantially more flexible blocks (PMDA reacted with ODA). In another embodiment, the block copolymer is derived from 10 to 40 mole percent blocks of pyromellitic dianhydride and 1,4-diaminobenzene and from 90 to 60 mole percent blocks of pyromellitic dianhydride and 4,4'-diaminodiphenyl ether.

Sub-Micron Filler

In accordance with the present disclosure, the filler is a sub-micron (in at least one dimension) filler or a mixture of sub-micron fillers.

In one embodiment, the polyimide of the present disclosure comprises a sub-micron filler:

1. being less than 550 nanometers (and in some embodiments, less than 475, 450, 425, 400, 375, 350, 325, 300, 275, 250, 225, or 200 nanometers) in at least one dimension (since fillers can have a variety of shapes in any dimension and since filler shape can vary along any dimension, the "at least one dimension" is intended to be a numerical average along that dimension);

2. having an average aspect ratio greater than 3, 4, 5, 6, 7, 8, 9, 10, 11, 12, 13, 14, or 15 to 1;

3. being less than 100, 95, 90, 85, 80, 75, 70, 65, 60, 55, 50, 45, 40, 35, 30, 25, 20, 15 or 10 percent of the thickness of the polyimide substrate in all dimensions; and 4. being present in an amount between and optionally including any two of the following percentages: 10, 15, 20, 25, 30, 35, 40, and 45 volume percent of the polyimide substrate.

Suitable sub-micron fillers are generally stable at temperatures above 300, 350, 400, 425 or 450° C., and in some embodiments do not significantly decrease the electrical insulation properties of the polyimide substrate. In some embodiments, the sub-micron filler is selected from a group consisting of needle-like fillers (acicular), fibrous fillers, platelet fillers and mixtures thereof. In one embodiment, the sub-micron filler is substantially non-aggregated. The sub-micron filler can be hollow, porous, or solid.

In one embodiment, the sub-micron fillers of the present disclosure exhibit an aspect ratio of at least 3, 4, 5, 6, 7, 8, 9, 10, 11, 12, 13, 14, or 15 to 1. In one embodiment, the sub-micron filler aspect ratio is 5:1 or greater. In another embodiment, the sub-micron filler aspect ratio is 10:1 or greater, and in another embodiment, the aspect ratio is 12:1 or greater. In some embodiments, the sub-micron filler is selected from a group consisting of oxides (e.g., oxides comprising silicon, magnesium and/or aluminum), nitrides (e.g., nitrides comprising boron and/or silicon), carbides (e.g., carbides comprising tungsten and/or silicon) and combinations thereof. In some embodiments, the sub-micron filler is acicular titanium dioxide, talc, SiC fiber, platy $Al_2O_3$ or mixtures thereof. In some embodiments, the sub-micron filler is less than (as a numerical average) 50, 25, 20, 15, 12, 10, 8, 6, 5, 4, or 2 microns in all dimensions.

In yet another embodiment, carbon fiber and graphite can be used in combination with other sub-micron fillers to increase mechanical properties. However in one embodiment, the loading of graphite, carbon fiber and/or electrically conductive fillers may need to be below the percolation threshold (perhaps less than 10 volume percent), since graphite and carbon fiber fillers can diminish electrical insulation properties and in some embodiments, diminished electrical insulation properties are not desirable.

In some embodiments, the sub-micron filler is coated with a coupling agent. In some embodiments, the sub-micron filler is coated with an aminosilane coupling agent. In some embodiments, the sub-micron filler is coated with a dispersant. In some embodiments, the sub-micron filler is coated with a combination of a coupling agent and a dispersant. In some embodiments, the sub-micron filer is coated with a coupling agent, a dispersant or a combination thereof. Alternatively, the coupling agent and/or dispersant can be incorporated directly into the substrate and not necessarily coated onto the sub-micron filler. In some embodiments, the sub-micron filler comprises a acicular titanium dioxide, at least a portion of which is coated with an aluminum oxide.

In some embodiments, the sub-micron filler is chosen so that it does not itself degrade or produce off-gasses at the desired processing temperatures. Likewise in some embodiments, the sub-micron filler is chosen so that it does not contribute to degradation of the polymer.

In one embodiment, filler composites (e.g. single or multiple core/shell structures) can be used, in which one oxide encapsulates another oxide in one particle.

Polyimide Substrate

It has been discovered that relatively less expensive polyimides can be filled with sub-micron filler of the present disclosure and thereby perform, at least in some ways, more similarly to more expensive polyimides, but at a much lower cost. More expensive monomers such as BPDA or fluorinated monomers can at least in part (or entirely) be replaced with less expensive monomers. In addition to expensive monomers, some polyimides are more difficult to process commercially, such as BPDA//PPD due to blistering. Lower production rates drive up the cost of the film. Additionally, polyimides derived from all rigid rod monomers may have low CTE and high modulus but, when filled, have low elongation. It has been found that the submicron fillers that have an aspect ratio of 3:1 or greater can be incorporated at relatively high loading levels (10 to 45 volume percent) into less expensive, easily processable polyimides. The sub-micron filler of the present disclosure tends to increase the storage modulus and decrease or approximately maintain the CTE of the polyimide substrate of the present disclosure with out causing the substrate to become unduly brittle.

It is surprising that the sub-micron filler of the present disclosure may not behave in the same manner in all polyimides. Surprisingly in a rigid rod polyimide (BPDA//PPD) the CTE may be greater than in unfilled rigid rod polyimide.

The sub-micron filler of the present disclosure, when incorporated into the polyimides of the present disclosure, produce polyimide substrates having better properties compared to their conventional non-high aspect ratio (less than 3:1 aspect ratio) counterparts.

In some embodiments, the substrate comprises a polyimide derived from 100 mole percent of pyromellitic dianhydride as the aromatic dianhydride component; and 100 mole percent 4,4'-diaminodiphenyl ether as the aromatic diamine component and the sub-micron filler is acicular titanium dioxide, talc or mixture thereof. Is some embodiments, the polyimide is a homopolymer of pyromellitic dianhydride and 4,4'-diaminodiphenyl ether.

In another embodiment, the substrate comprises a polyimide wherein the polyimide is block copolymer derived from: 10 to 40 mole percent blocks of pyromellitic dianhydride and 1,4 diaminobenzene; from 90 to 60 mole percent blocks of pyromellitic dianhydride and 4,4'-diaminodiphenyl ether and the sub-micron filler is acicular titanium dioxide, talc or mixture thereof.

Thermal and Dimensional Stability

While it is generally known that the addition of filler will decrease CTE and increase storage modulus, it is surprising, that for the sub-micron fillers of the present disclosure, there is a threshold above which a significant increase in storage modulus and/or a decrease in CTE is observed. In one embodiment, the sub-micron filler will substantially maintain (within 80, 70. 60, 50, 40, 30, 20, 10, 5, 4, 3, 2, or 1 percent, plus or minus) the coefficient of thermal expansion (CTE) while improving mechanical and thermal properties.

In one embodiment, the substrates of the present disclosure have an in-plane CTE in a range between (and optionally including) any two of the following: 1, 5, 10, 15, 20, 25, 30 and 35 ppm/° C., where the in-plane coefficient of thermal expansion (CTE) is measured between 60° C. (or 50° C.) and 350° C.

Some unfilled block or random copolymers of the present disclosure can have a relatively low CTE. Thus, in some embodiments, sub-micron fillers of the present disclosure have little impact on a block copolymer CTE. In some embodiments, the sub-micron fillers of the present disclosure may increase the CTE of block or random copolymers having a low CTE but the CTE is still maintained in a desirable range. The thickness of a polyimide substrate can also impact CTE, where thinner films tend to give a lower CTE (and thicker films, a higher CTE), and therefore, substrate thickness can be used to fine tune substrate CTE, depending upon any particular application selected. The substrates of the present disclosure have a thickness in a range between (and optionally including) any of the following thicknesses (in microns): 5, 6, 8, 10, 12, 15, 20, 25, 50, 75, 100, 125 and 150 microns. Monomers and sub-micron fillers within the scope of the present disclosure can also be selected or optimized to fine tune CTE within the above range. Ordinary skill and experimentation may be necessary in fine tuning any particular CTE of the substrates of the present disclosure, depending upon the particular application. In some embodiments, the in-plane CTE of the substrate can be obtained by thermomechanical analysis utilizing a TA Instruments TMA-2940 run at 10° C./min, up to 400° C., then cooled and reheated to 400° C., with the CTE in ppm/° C. obtained during the reheat scan between 50° C. and 350° C. In another embodiment, the in-plane CTE of the film can be obtained by Thermal Mechanical Analysis (TA Instruments, TMA-2940, heat 10° C./min, up to 460° C., then cooled and reheat to 500° C.) was evaluated between 50-350° C. on the reheat. In another embodiment, the in-plane CTE of the film can be obtained by Thermal Mechanical Analysis (TA Instruments, TMA-2940, heat 10° C./min, up to 380° C., then cooled and reheated to 380° C.) and evaluated between 50-350° C. on the reheat.

In some embodiments, the sub-micron filler increases the storage modulus above the glass transition temperature (Tg) of the polyimide. In some embodiments, the sub-micron filler of the present disclosure increases the storage modulus at 25° C. at least 20, 22, 24, 26, 28 or 30% compared to sub-micron filler having an aspect ratio less than 3:1. In some embodiments, the sub-micron filler of the present disclosure increases the storage modulus at 480° C. to 500° C. at least 40, 42, 44 or 46% compared to sub-micron filler having an aspect ration less than 3:1. In some embodiments, the sub-micron filler of the present disclosure increases the storage modulus at 25° C. at least 38, 40, 42, 44 or 46% compared to unfilled polyimide. In some embodiments, the sub-micron filler of the present disclosure increases the storage modulus at 480° C. to 500° C. at least 52, 53, 54 or 55% compared to unfilled polyimide.

Typically, as the amount of filler increases in a film, the more brittle and difficult to process the film tends to become. Typically when tensile elongation is less than 20 percent, films are difficult to process, thus, are of limited commercial value. It is surprising that when the sub-micron fillers of the present disclosure are added to a polyimide having a mole ratio of dianhydride to diamine of 48-52:52-48 and ratio of X:Y is 20-80:80-20 where X is mole percent of rigid rod dianhydride and rigid rod diamine, and Y is mole percent of non-rigid rod dianhydride and non-rigid rod diamine based upon the total dianhydride component and diamine component of the polyimide, the tensile elongation remains acceptable. In some embodiments, the tensile elongation remains acceptable when greater than 10 volume percent of the sub-micron filler is used. In one embodiment, the tensile elongation remains acceptable when greater than 30 volume percent of the sub-micron filler is used. In yet another embodiment, the tensile elongation remains acceptable when greater than 40 volume percent of the sub-micron filler is used.

Generally, when forming the polyimide, a chemical conversion process (as opposed to a thermal conversion process) will provide a lower CTE polyimide film. Thus, while the advantages of the present disclosure can be seen for both chemically or thermally converted polyimides, the advantages of incorporating the sub-micron filler of the present disclosure may be most useful for chemically converted polyimides of the present disclosure.

Substrate Formation

Polyimide substrates of the present disclosure can be made by methods well known in the art. In some embodiments, the polyimide substrate can be produced by combining the above monomers together with a solvent to form a polyamic acid (also called a polyamide acid solution). The dianhydride and diamine components are typically combined in a molar ratio of aromatic dianhydride component to aromatic diamine component of from 0.90 to 1.10. Molecular weight can be adjusted by adjusting the molar ratio of the dianhydride and diamine components.

Chemical or thermal conversion can be used in the practice of the present disclosure. In instances where chemical conversion is used, a polyamic acid casting solution is derived from the polyamic acid solution. In one embodiment, the polyamic acid casting solution comprises the polyamic acid solution combined with conversion chemicals, such as: (i) one or more dehydrating agents, such as, aliphatic acid anhydrides (acetic anhydride, etc.) and aromatic acid anhydrides; and (ii) one or more catalysts, such as, aliphatic tertiary amines (triethylamine, etc.), aromatic tertiary amines (dimethylaniline, etc) and heterocyclic tertiary amines (pyridine, picoline, isoquinoline, etc). The anhydride dehydrating material is often used in a molar excess of the amount of amide acid groups in the copolyamic acid. The amount of acetic anhydride used is typically about 2.0-3.0 moles per equivalent of amide acid. Generally, a comparable amount of tertiary amine catalyst is used.

In one embodiment, the polyamic acid is dissolved in an organic solvent at a concentration from about 5 weight percent up to and including 40 weight percent. In one embodiment, the polyamic acid is dissolved in an organic solvent at a concentration of about 5, 10, 15, 20, 25, 30, 35 or 40 weight percent. Examples of suitable solvents include: formamide solvents (N,N-dimethylformamide, N,N-diethylformamide, etc.), acetamide solvents (N,N-dimethylacetamide, N,N-diethylacetamide, etc.), pyrrolidone solvents (N-methyl-2-pyrrolidone, N-vinyl-2-pyrrolidone, etc.), phenol solvents (phenol, o-, m- or p-cresol, xylenol, halogenated phenols, catechol, etc.), hexamethylphosphoramide and gamma-butyrolactone. It is desirable to use one of these solvents or mixtures thereof. It is also possible to use combinations of these solvents with aromatic hydrocarbons such as xylene and toluene, or ether containing solvents like diglyme, propylene glycol methyl ether, propylene glycol, methyl ether acetate, tetrahydrofuran, and the like.

In one embodiment, the prepolymer can be prepared and combined with the sub-micron filler (dispersion or colloid thereof) using numerous variations to form the polyimide substrate of this disclosure. "Prepolymer" is intended to mean a lower molecular weight polymer, typically made with a small stoichiometric excess (about 2 to 4%) of diamine monomer (or excess dianhydride monomer). Increasing the molecular weight (and solution viscosity) of the prepolymer can be accomplished by adding incremental amounts of additional dianhydride (or additional diamine, in the case where the dianhydride monomer is originally in excess in the prepolymer) in order to approach a 1:1 stoichiometric ratio of dianhydride to diamine.

Useful methods for producing substrate in accordance with the present disclosure can be found in U.S. Pat. No. 5,166,308 to Kreuz, et al. Numerous variations are also possible, such as: (a) a method wherein the diamine components and dianhydride components are preliminarily mixed together and then the mixture is added in portions to a solvent while stirring, (b) a method wherein a solvent is added to a stirring mixture of diamine and dianhydride components (contrary to (a) above), (c) a method wherein diamines are exclusively dissolved in a solvent and then dianhydrides are added thereto at such a ratio as allowing to control the reaction rate, (d) a method wherein the dianhydride components are exclusively dissolved in a solvent and then amine components are added thereto at such a ratio to allow control of the reaction rate, (e) a method wherein the diamine components and the dianhydride components are separately dissolved in solvents and then these solutions are mixed in a reactor, (f) a method wherein the polyamic acid with excessive amine component and another polyamic acid with excessive dianhydride component are preliminarily formed and then reacted with each other in a reactor, particularly in such a way as to create a non-random or block copolymer, (g) a method wherein a specific portion of the amine components and the dianhydride components are first reacted and then the residual diamine components are reacted, or vice versa, (h) a method wherein the conversion chemicals are mixed with the polyamic acid to form a polyamic acid casting solution and then cast to form a gel film, (i) a method wherein the components are added in part or in whole in any order to either part or whole of the solvent, also where part or all of any component can be added as a solution in part or all of the solvent, (j) a method of first reacting one of the dianhydride components with one of the diamine components giving a first polyamic acid, then reacting the other dianhydride component with the other amine component to give a second polyamic acid, and then combining the amic acids in any one of a number of ways prior to film formation, and (k) a method of creating block copolymers by sequential addition, e.g., adding a first diamine and a first dianhydride to form a polyamic acid having excess dianhydride (or excess diamine) to create a first block and then adding a second diamine and a second dianhydride to the polyamic acid to form a second block in the presence of the first block; alternatively, blocks can be made based upon different dianhydrides (and the same diamine) or based upon different dianhydrides and different diamines (in each block), depending upon the particular application or properties desired.

The sub-micron filler (dispersion or colloid thereof) can be added at several points in the polyimide substrate preparation. In one embodiment, the colloid or dispersion is incorporated into a prepolymer to yield a Brookfield solution viscosity in the range of about 50-100 poise at 25° C. In an alternative embodiment, the colloid or dispersion can be combined with the monomers directly, and in this case, polymerization occurs with the filler present during the reaction. The monomers may have an excess of either monomer (diamine or dianhydride) during this "in situ" polymerization. The monomers may also be added in a 1:1 ratio. In the case where the monomers are added with either the amine (case i) or the dianhydride (case ii) in excess, increasing the molecular weight (and solution viscosity) can be accomplished, if necessary, by adding incremental amounts of additional dianhydride (case i) or diamine (case ii) to approach the 1:1 stoichiometric ratio of dianhydride to amine.

The polyamic acid casting solution can then be cast or applied onto a support, such as an endless belt or rotating drum. The polyamic acid contain conversion chemical reactants. Next, the solvent-containing film can be converted into a self-supporting film by baking at an appropriate temperature (thermal curing) to remove solvent or baking together with the chemical conversion reactants (chemical curing). The film can then be separated from the support, oriented such as by tentering, with continued thermal curing to provide a substrate.

Generally speaking, film smoothness is desirable, since surface roughness: i. can interfere with the functionality of the layer or layers deposited on the filled substrate of the present disclosure, ii. can increase the probability of electrical or mechanical defects, and iii. can diminish property uniformity along the substrate. In one embodiment, the sub-micron filler (and any other discontinuous domains) are sufficiently dispersed during substrate formation, such that the sub-micron filler (and any other discontinuous domains) are sufficiently between the surfaces of the substrate upon substrate formation to provide a final substrate having an average surface roughness (Ra) of less than 1000, 750, 500 or 400 nanometers. Surface roughness as provided herein can be determined by optical surface profilometry to provide Ra values, such as, by measuring on a Veeco Wyco NT 1000 Series instrument in VSI mode at 25.4x or 51.2x utilizing Wyco Vision 32 software.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, fillers or various reinforcing agents.

An alkoxy silane coupling agent (or any conventional, nonconventional, presently known or future discovered coupling agent) can be added during the process by pretreating the sub-micron filler prior to formulation. Alkoxysilane coupling agents can also be added during the "in situ" polymerization by combining the fillers and monomers with the alkoxysilane, generally so long as the coupling agent does not interfere with the polymerization reaction.

In some cases, the dianhydride can be contacted with the sub-micron filler. While not intending to be bound to any particular theory or hypothesis, it is believed such contact between the dianhydride and the sub-micron filler can functionalize the sub-micron filler with the dianhydride prior to further reaction with the monomers or prepolymer. Ultimately, a filled polyamic acid composition is generally cast into a film, which is subjected to drying and curing (chemical and/or thermal curing) to form a filled polyimide film. Any conventional or non-conventional method of manufacturing filled polyimide films can be used in accordance with the present disclosure. The manufacture of filled polyimide films in general is well known and need not be further described here. In one embodiment, the polyimide used in substrate of the present disclosure has a high glass transition temperature (Tg) of greater than 300, 310, 320, 330, 340, 350, 360, 370 380, 390 or 400° C. A high Tg generally helps maintain mechanical properties, such as storage modulus, at high temperatures.

In some embodiments, electrically insulating fillers may be added to modify the electrical properties of the substrate. In some embodiments, it is important that the substrate be free of pinholes or other defects (foreign particles, gels, filler agglomerates or other contaminates) that could adversely impact the electrical integrity and dielectric strength of the substrate, and this can generally be addressed by filtering. Such filtering can be done at any stage of the substrate manufacture, such as, filtering solvated filler before or after it is added to one or more monomers and/or filtering the polyamic acid, particularly when the polyamic acid is at low viscosity, or otherwise, filtering at any step in the manufacturing process that allows for filtering. In one embodiment, such filtering is conducted at the minimum suitable filter pore size or at a level just above the largest dimension of the selected filler material. In some embodiments, the sub-micron filler is subjected to intense dispersion energy, such as agitation and/or high shear mixing or media milling or other dispersion techniques, including the use of dispersing agents, when incorporated into the film (or incorporated into a polyimide precursor) to inhibit unwanted agglomeration above the desired maximum filler size or to break up aggregates which may be originally present in the sub-micron filler. As the aspect ratio of the sub-micron filler increases, so too does the tendency of the sub-micron filler's long axis to align or otherwise position itself parallel to the outer surfaces of the film.

A single layer film can be made thicker in an attempt to decrease the effect of defects caused by unwanted (or undesirably large) discontinuous phase material within the film. Alternatively, multiple layers of polyimide may be used to diminish the harm of any particular defect (unwanted discontinuous phase material of a size capable of harming desired properties) in any particular layer, and generally speaking, such multilayers will have fewer defects in performance compared to a single polyimide layer of the same thickness. Using multiple layers of polyimide films can diminish or eliminate the occurrence of defects that may span the total thickness of the film, because the likelihood of having defects that overlap in each of the individual layers tends to be extremely small. Therefore, a defect in any one of the layers is much less likely to cause an electrical or other type failure through the entire thickness of the film. In some embodiments, the substrate comprises two or more polyimide layers. In some embodiments, the polyimide layers are the same. In some embodiments, the polyimide layers are different. In some embodiments, the polyimide layers independently may comprise a thermally stable filler, reinforcing fabric, inorganic paper, sheet, scrim or combinations thereof. Optionally, 0-55 weight percent of the film also includes other ingredients to modify properties as desired or required for any particular application.

The substrate has sufficient storage modulus and is not unduly brittle. Thus a metal (or other reinforcement) backing layer is generally not necessary. However such reinforcement can optionally be placed on the substrate surface opposite to that on which the thin film transistor composition is to be deposited. In TFT applications, such a metal (or other reinforcement) backing layer is generally unnecessary or can be applied at a much smaller thickness, e.g. only about 10, 20, 30, 50, or 75 nanometers, relative to the use of a conventional such metal layer. In another embodiment, the metal layer may be applied to a thickness of greater than 75 nanometers if desired. In yet another embodiment, the metal layer of conventional thickness from 100 nanometers up to 500 microns may be used, even when not necessary and smaller thicknesses can be utilized. The metal layer can be useful in enhancing the mechanical integrity of the substrate during the transistor fabrication process, thus further ensuring against any tendency for the substrate to stretch or otherwise distort during handling, and thus reducing the possibility of distortion of the substrate during formation of the transistors thereon. In addition, a metal (or other reinforcement) backing layer can act as a light barrier to decrease any unwanted photo-effects in the semiconductor material (for Example, photogenerated current in an amorphous silicon film) caused by light incident on the rear surface of the substrate. The metal (or other reinforcement) backing layer, if used, need not be continuous; this layer may have apertures extending through it to reduce its stiffness and thus give the metal-backed substrate more flexibility. If such apertures are to be provided, it is generally desirable that they be formed in a regular pattern, and accordingly some or all of the apertures may be used for mechanical registration of the substrate with apparatus used in the fabrication process. Indeed, in some cases, a patterned metal backing layer might be used as a shadow mask for exposure of photoresist in a patterning step during formation of the transistors on the substrate. Alternatively or in addition, it may be advantageous to incorporate a dye into the polyimide itself to refuse or eliminate such undesirable photo-effects.

In one embodiment, the thin film transistor composition comprises a passivating layer between the semiconductor material and the first surface.

Such a passivating layer is optional however, since the substrates of the present disclosure have: i. relatively good thermal and mechanical properties; and/or iii. relatively high surface electrical resistance (typically >$10^{16}$ Ohms). Such a passivating layer can optionally be used, and if used, the passivation layer can generally be of a thickness that is less than conventional due to the excellent performance of the substrate, e.g., in a range between and optionally including any two of the following thicknesses: 4, 5, 8, 10, 12, 15, 20, 25 and 50 nm. In some embodiments, the passivating layer comprises silicon dioxide or aluminum nitride. In some embodiments, the thin film transistor comprises a second passivating layer on the second surface.

Passivation can be useful not only for increasing the surface resistance of the substrate, and thus for increasing electrical insulation between adjacent conductors, but also for increasing the dimensional stability of the substrate by preventing the substrate from absorbing water during processing, and for the latter purpose it is desirable to place the passivating layer on both surfaces of the substrate. The performance of the substrates of the present invention is such that a conventional post-bake of the passivated substrate may be unnecessary. If such post-baking of the passivated film is desired, it can be carried out at a temperature that is less than conventional, e.g., at a temperature optionally less than about 300, 275 or 250° C. for a period of time optionally less than conventional, e.g., less than about 1, 2, 3, 4, 5 or 6 hours. Such post baking of the film with the thin film transistor composition thereon can drive off water and any other volatile materials absorbed on the substrate thus reducing swelling of the substrate due to water absorption and increasing the dimensional stability of the substrate during the formation of transistors thereon.

In one embodiment, an inverted transistor design is conducted, in which the gate electrodes lie adjacent the film. To form such inverted transistors, the first step (after any optional passivation and/or optional pre-baking of the film in the ways already described) is the deposition of a metal layer, e.g., chromium, on the film. In one embodiment, the substrate comprises a metal layer, the metal layer having a thickness less than 50 nanometers and the metal layer being on the side thereof remote from the semiconductor material.

In some embodiments, the metal layer has walls defining apertures extending through the metal layer. The metal can be deposited as a continuous film, typically having a thickness in the range of about 50 to about 200 nm, and thereafter the metal can be patterned, typically by conventional photolithographic techniques, prior to the deposition of the semiconductor material, to form the gate electrodes and the select lines of the transistor array to be formed. In some embodiments, the thin film transistor composition additionally comprises a dielectric layer between the semiconducting material and the passivating layer. In such an embodiment, the next step in the process is the deposition of a layer of dielectric material. This deposition can be conveniently effected by plasma enhanced chemical vapor deposition. In some embodiments, the dielectric layer comprises silicon nitride.

The semiconductor material can be deposited by plasma enhanced chemical vapor deposition. In some embodiments, the semiconductor material comprises amorphous silicon. The amorphous silicon layer (and the associated dielectric layer) can be left unpatterned so that the amorphous silicon layer extends continuously between pairs of adjacent transistors. In some embodiments, the semiconductor material further comprises a n-type silicon layer on the amorphous silicon. The n-type silicon can be deposited over the amorphous silicon by plasma enhanced chemical vapor deposition. Finally (after a cleaning step to remove residues from the chemical vapor deposition processes) a metal layer, for Example an aluminum layer, can be deposited over the n-type silicon layer by thermal evaporation. The metal layer can then be patterned to form source and drain electrodes by conventional photolithographic techniques, and the patterned metal layer can be used as an etch mask for a reactive ion etch of the n-type silicon layer, e.g., etching with a carbon tetrafluoride/oxygen mixture. In some embodiments, the patterned layer of metal located on the n-type silicon layer wherein the n-type silicon layer defines a complementary pattern to the patterned layer of metal so that the n-type silicon layer is only under the patterned layer of metal.

One embodiment of the present disclosure will now be described in more detail, though by way of illustration only, with reference to the accompanying drawing, which shows a schematic cross-section through a single transistor formed on a polyimide film of the present disclosure. The accompanying drawing shows a single transistor of a transistor array (generally designated 10) formed on a polyimide substrate 12. This substrate 12 is shown in the drawing provided with an optional stainless steel metal backing layer 14 through which extend regularly-spaced apertures 16, only one of which is visible in the drawing. On the upper surface of the substrate 12 (as shown in the drawing), there is deposited an optional passivating layer 18 formed of silica or silicon nitride.

On the upper surface of passivating layer 18, there are deposited an array of spaced metal gate electrodes 20 (only one of which is seen in the drawing), and above the electrodes 20 are deposited successively a dielectric layer 22, formed of silicon nitride, and a layer 24 of amorphous silicon. The dielectric layer 22 and the amorphous silicon layer 24 can be left unpatterned. Finally, the transistor array comprises a layer 26 of n-type silicon and a metal electrode layer 28; both of these layers are patterned using any conventional process to provide the source and drain electrodes of the transistors.

In another embodiment of the TFT is generally similar to that described above, but has a substrate without a metal backing or passivating layer. In such an embodiment, the substrate may optionally be pre-baked, and a layer of chromium at 100 nm thickness can be deposited upon the substrate by thermal evaporation and photolithographically patterned to form the gate electrodes and select lines of the final transistor array. Next, a 320 nm layer of silicon nitride dielectric can be deposited on the substrate by plasma enhanced chemical vapor deposition (PECVD) using a silane/ammonia mixture. During this deposition, the substrate is subject to a processing temperature of 300, 325, 350, 375, 400, 425 or 450° C. A 160 nm layer of amorphous silicon semiconductor material can then be deposited by (PECVD) from pure silane, followed by deposition of a 40 nm layer of n-type amorphous silicon by PECVD from a silane/phosphine mixture.

Following these PECVD steps, a layer of aluminum can be deposited on the substrate and patterned photolithographically to form the source and drain electrodes of the transistor array. The film can be then subjected to a reactive ion etch using a carbon tetrafluoride/oxygen mixture to pattern the n-type silicon layer using the patterned aluminum layer as an etch mask; the amorphous silicon and silicon nitride layers need not be patterned during this step. Finally, a low resolution patterning step can be used to pattern the amorphous silicon and silicon nitride layers to enable electrical contact to be made with the select bond line sites.

The thin film transistor array thus fabricated can be used directly in the manufacturer of an electrophoretic display, or other types of display, without further processing. In some cases, it is desirable to provide a barrier layer covering the thin film transistor to protect the transistors against the effects of solvents or other materials which may tend to diffuse out of the electrophoretic display.

Thin film transistor arrays produced by the processes of the present disclosure can be used in encapsulated electrophoretic displays such as those described in U.S. Pat. Nos. 5,930,026; 5,961,804; 6,017,584; 6,067,185; 6,118,426; 6,120,588; 6,120,839; 6,124,851; 6,130,773; 6,130,774; and 6,172,798.

From the foregoing, it will be seen that the process of the present disclosure provides a process for forming transistors on a flexible film which permits the use of higher processing temperatures than prior art processes, and which can thus produce semiconductor layers of higher quality than prior art processes. The substrate used in the present process has a coefficient of thermal expansion which closely matches that of most semiconductor layers, so reducing the risk of cracking and/or delamination of the semiconductor layer due to differences in thermal expansion between this layer and the substrate. The present disclosure provides a process which is well-adapted to roll-to-roll operation, and thus the present process is very suitable for the fabrication of large area transistor arrays on flexible films.

EXAMPLES

The invention will be further described in the following Examples, which are not intended to limit the scope of the invention described in the claims.

In all Examples, for calculations to convert to composition weight percentages to equivalent volume percentages, densities of 4.2 g/cc for the acicular titanium dioxide, 2.75 g/cc for talc, 3.22 g/cc for SiC and 1.42 g/cc for the polyimide were used.

Examples 1-4 demonstrate that the sub-micron filler of the present disclosure at 10 volume percent or higher significantly increase storage modulus and lower CTE when compared to unfilled Comparative Example 1, while maintaining adequate elongation to break.

Example 1

15 vol % (34.3 wt %) acicular $TiO_2$ in PMDA//ODA.

25.0 grams of acicular $TiO_2$ (FTL-110, Ishihara Corporation, USA) was combined with 141.11 grams of anhydrous DMAC. This slurry was mixed at high shear for approximately 10 to 15 minutes using Silverson Model L4RT high-shear mixer (Silverson Machines, LTD, Chesham Baucks, England) equipped with a square-hole, high-shear screen (with a blade speed of approximately 4000 rpm).

In a round bottom flask, 74.1 grams of the slurry containing acicular $TiO_2$ was mixed with 116.94 grams of PMDA//ODA prepolymer (20 wt % solution in anhydrous DMAC), and the resulting mixture was stirred for approximately 24 hours. During this operation, a gentle nitrogen gas purge was used in the round bottom flask.

After stirring for approximately 24 hours, this material was filtered through 45 micron filter media (Millipore, 45 micron polypropylene screen, PP4504700).

In a separate container, a 6 wt % solution of pyromellitic anhydride (PMDA) was prepared by combining 9.00 g of PMDA (Aldrich 412287, Allentown, Pa.) and 15 ml of DMAC.

The PMDA solution was slowly added to the prepolymer slurry to achieve a final viscosity of 1090 poise. The formulation was stored overnight at 0° C. to allow it to degas.

The formulation was cast using a 25 mil doctor blade onto a surface of a glass plate to form a 3"×4" film. The cast film and the glass plate is then soaked in a solution containing 110 ml of 3-picoline (beta picoline, Aldrich, 242845) and 110 ml of acetic anhydride (Aldrich, 98%, P42053).

The film was subsequently lifted off of the glass surface, and mounted on a 3"×4" pin frame. The mounted film was placed in a furnace (Thermolyne, F6000 box furnace). The furnace was purged with nitrogen and heated according to the following temperature protocol:

40° C. to 125° C. (ramp at 4° C./min)
125° C. to 125° C. (soak 30 min)
125° C. to 250° C. (ramp at 4° C./min)
250° C. (soak 30 min)
250° C. to 400° C. (ramp at 5° C./min)
400° C. (soak 20 min)

The coefficient of thermal expansion was measured by thermomechanical analysis (TMA). A TA Instrument model 2940 was used in tension mode. The instrument was purged with $N_2$ gas at 30-50 ml/min. A mechanical cooler was also used, which allowed temperature of the instrument to rapidly cool down between heating cycles. The film was cut to a 2.0 mm width and 6-9 mm length (in MD or casting direction). The film was clamped lengthwise to a length of 7.5-9.0 mm. A preload tension was set for 5 grams of force. The film was then subjected to heating from 0° C. to 400° C. at 10° C./min rate, held at 400° C. for 3 minutes, and cooled back down to 0° C. A second heating cycle to 400° C. was performed in the same way. The calculations of thermal expansion coefficient in the unit of μm/m-° C. (or pp/° C.) from 60° C. to 400° C. were reported for the casting direction (MD) for the second heating cycle.

Storage modulus (E') was measured by a Dynamic Mechanical Analysis (DMA) instrument was used to characterize the mechanical behavior of the film. The DMA operation was based on the viscoelastic response of polymers subjected to a small oscillatory strain (e.g., 10 μm) as a function of temperature and time (TA Instruments, New Castle, Del., USA, DMA 2980). The films were placed under tension in a multifrequency-strain mode. A finite size of rectangular specimen was clamped between stationary jaws and movable jaws. The films were 6-6.4 mm in width, 0.03-0.05 mm thick and 10 mm in length. The MD direction was used, and the film was fastened with 3 in-lb torque force. The static force in the length direction was 0.05 N with autotension of 125%. The film was heated at frequency of 1 Hz from 0° to 500° C. at a rate of 3° C./min. The storage modulus at 25° C. was measured to be 5757 MPa.

Tensile properties (including % elongation at break) of the films were measured on an Instron model 3345 instrument. Crosshead gap (sample test length) was 1 inch (2.54 centimeters) and width was 0.5 inch (1.27 centimeters). Crosshead speed was 1 inch (2.54 centimeters)/min.

Results are shown in Table 1.

Example 2

10 vol % (24.70 wt %) acicular $TiO_2$ (FTL-110) in PMDA//HODA.

The same procedure as described in Example 1 was followed, with the following exceptions. 54.24 grams of the slurry containing acicular $TiO_2$ (FTL-110, 15 wt % in DMAC) was mixed with 136.15 grams of PMDA//ODA prepolymer (20 wt % in DMAC).

The material was finished with the PMDA solution to a viscosity of 899 poise.

CTE, E' and % elongation at break were measured as in Example 1.

Results are shown in Table 1.

Example 3

20 vol % (42.5 wt %) acicular $TiO_2$ (FTL-110) in PMDA//ODA

The same procedure as described in Example 1 was followed, with the following exceptions. 57.7 grams of the slurry containing acicular $TiO_2$ (FTL-110, 15 wt % in DMAC, high shear mixed) was combined with 63.3 grams of PMDA//ODA prepolymer (20.6 wt % in DMAC).

The material was finished with the PMDA solution to a viscosity of 1380 poise.

CTE, E' and % elongation at break were measured as in Example 1.

Results are shown in Table 1.

Example 4

10 vol % SiC fibers (20.1 wt %) in PMDA//ODA

The same procedure as described in Example 1 was followed, except for the following differences. 24.75 grams of SiC fibers (Silar® Silicon Carbide whiskers, beta form, Advanced Composites Materials, Greer, S.C., USA) was combined with 140.25 grams of anhydrous DMAC. The slurry was blended under high shear conditions, as described in Example 1.

45.62 grams of this slurry was combined with 144.44 grams of PMDA//ODA prepolymer (20.6 wt % in DMAC).

CTE, E' and % elongation at break were measured as in Example 1.

Results are shown in Table 1.

Comparative Example 1

Unfilled PMDA//ODA

The same procedure as described in Example 1 was followed, with the following exceptions. The slurry containing the inorganic particles was not added to the PDMA//ODA prepolymer (prepolymer is 20 wt % in DMAC).

The material was finished with the PMDA solution to a viscosity of 90 poise.

CTE, E' and % elongation at break were measured as in Example 1.

Results are shown in Table 1.

Comparative Examples 2-5 demonstrate the sub-micron filler of the present disclosure present below 10 volume percent does not produce a significant increase in storage modulus (especially storage modulii at 500° C.) or decrease CTE (relatively minor improvement in storage modulus and CTE).

Comparative Example 2

2.5 vol % (7 wt %) acicular $TiO_2$ in PMDA//ODA

A procedure similar to that described in Example 1 was used, except for the following differences. 24.08 grams of acicular $TiO_2$ (FTL-110, Ishihara Corporation, USA) was combined with 135.92 grams of anhydrous DMAC, and the slurry mixed at high shear.

10.1 grams of the slurry containing acicular $TiO_2$ was mixed with 109.9 grams of PMDA//ODA prepolymer.

CTE, E' and % elongation at break were measured as in Example 1.

Results are shown in Table 1.

Comparative Example 3

5 vol % (13.5 wt %) acicular $TiO_2$ in PMDA//ODA

A procedure similar to that described in Example 1 was used, except for the following differences. 24.08 grams of acicular $TiO_2$ (FTL-110, Ishihara Corporation, USA) was combined with 135.92 grams of anhydrous DMAC, and the slurry mixed at high shear.

19.1 grams of the slurry containing acicular $TiO_2$ was mixed with 100.9 grams of PMDA//ODA prepolymer.

CTE, E' and % elongation at break were measured as in Example 1.

Results are shown in Table 1.

Comparative Example 4

6.5 vol % (17.1 wt %) acicular $TiO_2$ in PMDA//ODA

A procedure similar to that described in Example 1 was used, except for the following differences. 2 4.08 grams of acicular $TiO_2$ (FTL-110, Ishihara Corporation, USA) was combined with 135.92 grams of anhydrous DMAC, and the slurry mixed at high shear.

23.96 grams of the slurry containing acicular $TiO_2$ was mixed with 96.1 grams of PMDA//ODA prepolymer.

CTE, E' and % elongation at break were measured as in Example 1.

Results are shown in Table 1.

Comparative Example 5

8.5 vol % (21.6 wt %) acicular $TiO_2$ in PMDA//ODA

A procedure similar to that described in Example 1 was used, except for the following differences.

24.08 grams of acicular TiO$_2$ (FTL-110, Ishihara Corporation, USA) was combined with 135.92 grams of anhydrous DMAC, and the slurry mixed at high shear.

30.0 grams of the slurry containing acicular TiO$_2$ was mixed with 90.0 grams of PMDA//ODA prepolymer.

CTE, E' and % elongation at break were measured as in Example 1.

Results are shown in Table 1.

Comparative Example 6

15 vol % (34.3 wt %) less than 3:1 aspect ratio TiO$_2$ in PMDA//ODA

Comparative Example 6 demonstrates that filler having an aspect ratio less than 3:1 produces a film with lower storage modulus and higher CTE compared to Example 1 which has sub-micron filler with an aspect ratio of at least 3:1 at 15 volume percent. The film was brittle on the edges, and would not be viable in a commercial manufacturing process.

The same procedure as described in Example 1 was followed, with the following exceptions. 33.84 grams of the slurry containing Du Pont Light Stabilized Titania, 210 (Du Pont, Wilmington, Del., 25 wt % in DMAC, high shear mixed) was combined with 86.2 grams of PMDA//ODA prepolymer (20.6 wt % in DMAC).

The material was finished with the PMDA solution to a viscosity of 1100 poise.

Du Pont Titania 210 is a fine white powder with a distribution of particles centered in the range of 130-140 nm on a weight basis. The particles are roughly spherical.

CTE, E' and % elongation at break were measured as in Example 1.

Results are shown in Table 1.

Comparative Example 7

Unfilled BPDA//PPD

The same procedure as described for Comparative Example 8 was followed, except that acicular TiO$_2$ was not added to the formulation.

CTE, E' and % elongation at break were measured as in Example 1.

Results are shown in Table 1.

Comparative Examples 8-9 demonstrate that the sub-micron filler of the present disclosure does not behave predictably in all polyimides. In the case of a BPDA//PPD system, CTE dramatically increases (greater than a factor of 2) with approximately 15 vol % of acicular of TiO$_2$ is introduced.

Comparative Example 8

14.64 vol % (33.7 wt %) acicular TiO$_2$ (FTL-110) in BPDA//PPD.

CTE increased with the introduction of acicular TiO$_2$.

BPDA//PPD prepolymer (69.3 g of a 17.5 wt % solution in anhydrous DMAC) was combined with 5.62 g of acicular TiO$_2$ (FTL-110, Ishihara Corporation, USA) and the resulting slurry was stirred for 24 hours. In a separate container, a 6 wt % solution of pyromellitic anhydride (PMDA) was prepared by combining 0.9 g of PMDA (Aldrich 412287, Allentown, Pa.) and 15 ml of DMAC.

The PMDA solution was slowly added to the prepolymer slurry to achieve a final viscosity of 653 poise. The formulation was stored overnight at 0° C. to allow it to degas.

The formulation was cast using a 25 mil doctor blade onto a surface of a glass plate to form a 3"×4" film. The glass was pretreated with a release agent to facilitate removal of the film from the glass surface. The film was allowed to dry on a hot plate at 80° C. for 20 minutes. The film was subsequently lifted off the surface, and mounted on a 3"×4" pin frame.

After further drying at room temperature under vacuum for 12 hours, the mounted film was placed in a furnace (Thermolyne, F6000 box furnace). The furnace was purged with nitrogen and heated according to the following temperature protocol:

| | |
|---|---|
| 125° C. | (30 min) |
| 125° C. to 350° C. | (ramp at 4° C./min) |
| 350° C. | (30 min) |
| 350° C. to 450° C. | (ramp at 5° C./min) |
| 450° C. | (20 min) |
| 450° C. to 40° C. | (cooling at 8° C./min) |

CTE, E' and % elongation at break were measured as in Example 1.

Results are shown in Table 1.

Comparative Example 9

14.64 vol % acicular TiO$_2$ (FTL-110) in BPDA//PPD.

The elongation to break is very low. The film is too brittle to be manufacturable.

The same procedure as described in Example 1 was used, except for the following differences. 33.99 grams of acicular TiO$_2$ (FTL-110, Ishihara Corporation, USA) was combined with 191.9 grams of anhydrous DMAC. This slurry was mixed at high shear for approximately 10 to 15 minutes using Silverson Model L4RT high-shear mixer (Silverson Machines, LTD, Chesham Baucks, England) equipped with a square-hole, high-shear screen (with a blade speed of approximately 4000 rpm).

129.25 g of BPDA//PPD prepolymer (17.5 wt % solution in anhydrous DMAC) was combined with 69.335 grams of the slurry containing acicular TiO$_2$. The resulting slurry was stirred for 24 hours. In a separate container, a 6 wt % solution of pyromellitic anhydride (PMDA) was prepared by combining 0.9 g of PMDA (Aldrich 412287, Allentown, Pa.) and 15 ml of DMAC.

The PMDA solution was slowly added to the prepolymer slurry to achieve a final viscosity of 998 poise.

After chemical imidization the film was lifted off of the glass surface, and mounted on a 3"×4" pin frame. The mounted film was placed in a furnace (Thermolyne, F6000 box furnace). The furnace was purged with nitrogen and heated according to the following temperature protocol:

| | |
|---|---|
| 125° C. | (30 min) |
| 125° C. to 350° C. | (ramp at 4° C./min) |
| 350° C. | (30 min) |
| 350° C. to 450° C. | (ramp at 5° C./min) |
| 450° C. | (20 min) |
| 450° C. to 40° C. | (cooling at 8° C./min) |

CTE, E' and % elongation at break were measured as in Example 1.

Results are shown in Table 1.

Comparative Example 10

Unfilled PMDA//ODA

Three 180 g portions of a prepolymer of PMDA and ODA (prepared in DMAC at about 20.6%, approximately 50 poise viscosity) were diluted to 18% polymer solids via the addition of 26 g of DMAC to give three 206 g portions of diluted polymers. One of these three diluted prepolymer samples was reacted ("finished") to a viscosity of about 2100 poise (Brookfield DV-II+ viscometer with a #LV5 spindle) by stepwise additions of a 6 wt % PMDA solution in DMAC with thorough mixing to increase the molecular weight (hereafter referred to as "finished polymer"). After pressure filtering the solution through a polypropylene screen filter disk (45 micron), the solution was degassed under vacuum to remove air bubbles and then this solution was cast onto a letter size sheet of clear polyester film (approximately 3 mil thick). The polyamic acid coating on the polyester sheet was subsequently immersed in a bath containing a 1/1 v/v mixture of acetic anhydride and 3-picoline. After about 2 minutes, once the partially imidized coating began to separate from the polyester sheet, it was removed from the bath and pinned on a approximately 8"×8" pin frame and allow to stand at room temperature in a lab hood for about 10-20 min. Next, the film on the pin frame was placed in a nitrogen purged oven and after purging at about 40° C. for 30 minutes, this oven was ramped to 320° C. over 70 minutes, held there for 30 minutes, then ramped to 450° C. over about 16 minutes, and held there for 4 minutes, in order to cure to polyimide. After cooling, the resulting 2.4 mil (61 micron) film was removed from the oven and pin frame.

Storage modulus (E') by Dynamic Mechanical Analysis (TA Instruments, DMA-2980, 5° C./min) was measured by heating from room temperature to 500° C. at 5° C./min.

Coefficient of thermal expansion (CTE) by Thermal Mechanical Analysis (TA Instruments, TMA-2940, heat 10° C./min, up to 460° C., then cool and reheat to 500° C.) was evaluated between 50-350° C. on the reheat.

% Tensile Elongation (Instron model 3345 tensile tester)– 0.5 in specimen width, 1 inch (2.54 centimeters) gauge length, 1 inch (2.54 centimeters)/min crosshead speed.

Results are shown in Table 1.

Comparative Example 11

5.4 vol % (10 wt %) talc in PMDA//ODA.

Comparative Example 11 demonstrates talc below about 5.5 volume percent does not behave predictably.

In a similar manner to Comparative Example 10, a portion of a prepolymer of PMDA and ODA (prepared in DMAC at about 20.6%, approximately 50 poise viscosity) was diluted to 18% polymer solids via the addition of DMAC. Then, the prepolymer was blended with SF310 talc for several minutes in a Thinky ARE-250 centrifugal mixer to yield a dispersion of the filler in the PAA solution, to achieve about a 10 wt % loading in the PI film. Finishing, filtration, casting and curing was similar to as described in Comparative Example 10. A 1 mil (25 micron) film was produced.

CTE, E' and % elongation at break were measured as in Comparative Example 10.

Results are shown in Table 1.

Examples 5-9 demonstrate talc above about 5.5 volume percent significantly increase storage modulus and lower CTE while maintaining adequate elongation to break.

Example 5

14.0 vol % (24 wt %) talc in PMDA//ODA.

The same procedure as described in Example 1 was followed, with the following exceptions. 25 grams of talc (Flextalc 610, Kish Company, Inc., Mentor, Ohio) was mixed, at high shear, with 141 grams of anhydrous DMAC.

55.9 grams of this slurry was mixed with 134.7 grams of PMDA//ODA prepolymer.

CTE, E' and % elongation at break were measured as in Example 1.

Results are shown in Table 1.

Example 6

18 vol % (30 wt %) talc in PMDA//ODA.

In a similar manner to Comparative Example 11, the second of the 206 g portions of the diluted prepolymer from Comparative Example 10 was blended with 14.77 g of Flextalc 610 (Lot M1085, Kish Co., Mentor, Ohio). Finishing, filtration, casting and curing was similar to as described in Comparative Example 10. Filler loading was approximately 30 wt % in the polyimide film. A 3.2 mil (81 micron) film was produced.

CTE, E' and % elongation at break were measured as in Comparative Example 10.

Results are shown in Table 1.

Example 7

18.1 vol % (30 wt %) talc in PMDA//ODA.

In a similar manner to Comparative Example 11, the third of the 206 g portions of the diluted prepolymer from Comparative Example 10 was blended with 14.77 g of SF310 talc (Kish Co., Mentor, Ohio). Finishing, filtration, casting and curing was similar to as described in Comparative Example 10. Filler loading was approximately 30 wt % in the polyimide film. A 3.2 mil (81 micron) film was produced.

CTE, E' and % elongation at break were measured as in Comparative Example 10.

Results are shown in Table 1.

Example 8

34 vol % (50 wt %) talc in PMDA//ODA.

In a similar manner to Comparative Example 11, the PMDA//ODA prepolymer was blended with SF310 talc to achieve about a 50 wt % loading in the PI film. Finishing, filtration, casting and curing was similar to as described in Comparative Example 10 Filler loading was approximately 50 wt % in the polyimide film. A 1.8 mil (46 micron) film was produced.

CTE, E' and % elongation at break were measured as in Comparative Example 10.

Results are shown in Table 1.

Example 9

43.6 vol % (60 wt %) talc in PMDA//ODA.

In a similar manner to Comparative Example 11, the PMDA//ODA prepolymer was blended with SF310 talc to achieve about a 60 wt % loading in the PI film. Finishing, filtration, casting and curing was similar to as described in Comparative Example 10. A 1.3 mil (33 micron) film was produced.

CTE, E' and % elongation at break were measured as in Comparative Example 10.

Results are shown in Table 1.

Examples 10-11 demonstrate sub-micron fillers of the present disclosure in polyimide copolymers above 10 volume percent significantly increases storage modulus and lowers CTE when compared to unfilled copolymer in Comparative Example 13.

Example 10

18.1 vol % (30 wt %) talc in random copolymer of PMDA//ODA/PPD 100//70/30.

In a similar manner to Comparative Example 11, a 186.87 g portion of the prepolymer from Comparative Example 13 was blended with 13.13 g of Flextalc 610 (Lot M6734, Kish Co., Mentor, Ohio). Finishing, filtration, casting and curing was similar to as described in Comparative Example 10. Filler loading was approximately 30 wt % in the polyimide film. A 2.2 mil (56 micron) film was produced.

CTE, E' and % elongation at break were measured as in Comparative Example 10.

Results are shown in Table 1.

Example 11

12.6 vol % (30 wt %) acicular $TiO_2$ in random copolymer of PMDA//ODA/PPD 100//70/30.

In a similar manner to Comparative Example 11, a 173 g portion of the prepolymer from Comparative Example 13 was blended with 27 g of a milled/dispersed 45 wt % slurry of acicular TiO2 (FTL-110 powder from Ishihara Corp. (USA)) in DMAC. Finishing, filtration, casting and curing was similar to as described in Comparative Example 10. Filler loading was approximately 30 wt % in the polyimide film. A 1.1 mil (28 micron) film was produced.

CTE, E' and % elongation at break were measured as in Comparative Example 10.

Results are shown in Table 1.

Comparative Example 12

Unfilled random copolymer of PMDA//ODA/PPD 100//70/30.

In a 1.5 liter beaker inside a nitrogen purged glove box, 15.118 g of PPD (0.1398 moles) and 65.318 g (0.3262 moles) ODA were added to 779.2 g of DMAC well agitated with a mechanical stirrer. After brief mixing at room temperature, 99.612 g (0.4567 moles) of PMDA was slowly added to maintain the temperature below 40° C., followed by 41.0 g DMAC and the reaction was allowed to proceed for about 2 hours. The resulting prepolymer solution (98% overall stoichiometry of dianhydride to diamine, 18% polymer solids), was decanted into a bottle and stored in a freezer until use. A portion of this prepolymer was finished similarly as in Example A, filtered, and then a film was cast and cured similarly to Comparative Example 10. A 1.4 mil (36 micron) film was produced.

CTE, E' and % elongation at break were measured as in Comparative Example 10.

Results are shown in Table 1.

Examples 12 and 13 demonstrate that a mixture of sub-micron fillers of the present disclosure significantly increase storage modulus and lower CTE when compared to unfilled polyimide in Comparative Example 10.

Example 12

10 wt % talc, 20 wt % acicular $TiO_2$ in polymer of PMDA//ODA.

A 168.21 g portion of a prepolymer of PMDA and ODA (prepared in DMAC at about 20.6%, approximately 50 poise viscosity) was blended together with 4.60 g SF310 talc and 20.46 g FTL-110 $TiO_2$ (45% slurry as described in Example 11 to achieve 10 wt % and 20 wt % loading respectively of the sub-micron fillers in the PI film (30 wt % total). Finishing, filtration, casting and curing was similar to as described in Comparative Example 10. A 1.0 mil (25 micron) film was produced.

CTE, E' and % elongation at break were measured as in Comparative Example 10.

Results are shown in Table 1.

Example 13

20 wt % talc, 10 wt % acicular $TiO_2$ in polymer of PMDA//ODA.

In a similar manner to Example 12, a 173.13 portion of the PMDA//ODA prepolymer was blended together with 9.45 g SF310 talc and 10.50 g FTL-110 $TiO_2$ (45% slurry as described in Example 11) to achieve 20 wt % and 10 wt % loading respectively of the sub-micron fillers in the PI film (30 wt % total). Finishing, filtration, casting and curing was similar to as described in Comparative Example 10. A 2.2 mil (56 micron) film was produced.

CTE, E' and % elongation at break were measured as in Comparative Example 10.

Results are shown in Table 1.

Examples 14 and 15 demonstrate a $TiO_2$ sub-micron filler of the present disclosure does not behave in the same manner in all polyimides in regards to CTE.

Example 14

11.7 vol % acicular $TiO_2$ (28.23 wt %) in block copolymer of PMDA//ODA/PPD 100//80/20.

High aspect ratio $TiO_2$ in the block copolymer of Example 14 significantly increases storage modulus while largely maintaining CTE compared to unfilled block copolymer of Comparative Example 13.

A similar procedure as described in Example 1 was used, except for the following differences. To prepare the prepolymer, 1.36 grams of PPD was combined with 110.0 grams of anhydrous DMAC and stirred, with gentle heating at 40° C. for approximately 20 minutes. 2.71 grams of PMDA was then added to this mixture to create the first block, which was stirred with gentle heating (35-40° C.) for approximately 2.5 hours. The mixture was allowed to cool to room temperature.

To this formulation, 10.10 grams of ODA was added and allowed to dissolve in to the formulation for about 5 minutes. An ice water bath was then used to control the temperature during the subsequent PMDA addition. 10.9 g PMDA was slowly added to this mixture. An addition 15 grams of DMAC was added to the formulation and the reaction was allowed to stir with gentle heat (30-35° C.) for 90 minutes. The mixture was allowed to stir at room temperature for approximately 18 hours.

In a separate container, 20.88 grams of acicular $TiO_2$ (FTL-11) was combined with 25.52 g of anhydrous DMAC and 0.426 g of Solplus D540 (Lubrizol) and milled for 24 hours in a jar mill using 8 mm spherical milling media.

14.2 gram of the slurry containing $TiO_2$ was mixed with 105.8 grams of the prepolymer formulation described above.

A modified heating procedure was used, as shown below:

| | |
|---|---|
| 40° C. to 125° C. | (ramp at 4° C./min) |
| 125° C. | (soak 30 min) |
| 125° C. to 350° C. | (ramp at 4° C./min) |
| 350° C. to 350° C. | (soak 30 min) |
| 350° C. to 450° C. | (ramp at 5° C./min) |
| 450° C. | (soak 20 min) |

CTE, E' and % elongation at break were measured as in Example

Results are shown in Table 1.

Example 15

17.5 vol % acicular TiO2 (38.5 wt %) in block copolymer of PMDA//ODA/PPD 100//80/20.

High aspect ratio TiO2 in the block copolymer of 15 significantly increases storage modulus while slightly decreasing CTE in the transverse direction compared to unfilled block copolymer of Comparative Example 13.

A similar procedure as described in Example 1 was used, except for the following differences. To prepare the prepolymer, 1.36 grams of PPD was combined with 113.0 grams of anhydrous DMAC and stirred, with gentle heating at 40° C. for approximately 20 minutes. 2.71 grams of PMDA was then added to this mixture to create the first block, which was stirred with gentle heating (35-40° C.) for approximately 2.5 hours. The mixture was allowed to cool to room temperature.

To this formulation, 10.10 grams of ODA was added and allowed to dissolve in to the formulation for about 5 minutes. An ice water bath was then used to control the temperature during the subsequent PMDA addition. 10.9 g PMDA was slowly added to this mixture. An additional 12 grams of DMAC was added to the formulation and the reaction was allowed to stir with gentle heat (30-35 degrees) from 90 minutes. The mixture was allowed to stir at room temperature for approximately 18 hours.

In a separate container, 20.88 grams of acicular TiO2 (FTL-11) was combined with 25.52 g of anhydrous DMAC and 0.426 g of Solplus D540 (Lubrizol) and milled for 24 hours in a 4" (internal diameter) nylon jar mill using 8 mm spherical milling media, turning at 80 rpm.

15.34 gram of the slurry containing $TiO_2$ was mixed with 72.0 grams of the prepolymer formulation described above.

A modified heating procedure was used, as shown below:

| | |
|---|---|
| 40° C. to 125° C. | (ramp at 4° C./min) |
| 125° C. | (soak 30 min) |
| 125° C. to 350° C. | (ramp at 4° C./min) |
| 350° C. to 350° C. | (soak 30 min) |
| 350° C. to 450° C. | (ramp at 5° C./min) |
| 450° C. | (soak 20 min) |

CTE, E' and % elongation at break were measured as in Example 1.

Results are shown in Table 1.

Comparative Example 13

Unfilled block copolymer of PMDA//ODA/PPD 100//80/20.

The same procedure was used as described in Example 15 was used, except that the acicular TiO2 slurry was not added to the formulation. The final viscosity of the formulation was 1000-1200 poise.

CTE, E' and % elongation at break were measured as in Example 1.

Results are shown in Table 1.

Example 16

12.6 vol % acicular $TiO_2$ (30 wt %) Filled block copolymer of PMDA//ODA/PPD 100//70/30.

Example 16 demonstrates acicular $TiO_2$ sub-micron filler of the present disclosure does not behave in the same manner in all polyimides in regards to CTE. CTE increases compared to unfilled block copolymer in Comparative Example 14 but still remains in a desirable range.

In a similar manner to Comparative Example 11, a 173 g portion of the prepolymer from Comparative Example 14 was blended with 27 g of a milled/dispersed 45 wt % slurry of acicular $TiO_2$ (FTL-110 powder from Ishihara Corp. (USA)) in DMAC. Finishing, filtration, casting and curing was similar to as described in Comparative Example 10. Filler loading was approximately 30 wt % in the polyimide film. A 3.0 mil (76 micron) film was produced.

CTE, E' and % elongation at break were measured as in Comparative Example 10.

Results are shown in Table 1.

Comparative Example 14

Unfilled block copolymer of PMDA//ODA/PPD 100//70/30.

In a 1.5 liter beaker inside a nitrogen purged glove box, 15.115 g of PPD were added to 396.7 g of DMAC well agitated with a mechanical stirrer. After brief mixing at room temperature (some but not all PPD had dissolved), 28.962 g of PMDA was slowly added to maintain the temperature below 40° C. The monomers dissolved and reacted and the polyamic acid (PAA) solution was allowed to stir for 1 hr. Afterwards, the solution was diluted with 382.3 g of DMAC and then 65.304 g ODA was added. This solution was stirred for 30 min and the ODA dissolved into the PAA solution. Subsequently, 70.627 g of PMDA was slowly added, followed by 41.0 g DMAC and the reaction was allowed to proceed for about 2 hours. The resulting prepolymer solution (98% overall stoichiometry of dianhydride to diamine, 18% polymer solids), was decanted into a bottle and stored in a freezer until use. A 180 g portion of this prepolymer was finished as in Comparative Example 10 to about 2200 poise, filtered, and then a film was cast and cured similarly to Comparative Example 10. Properties of the resulting 2.2 mil (56 micron) film CTE, E' and % elongation at break were measured as in Comparative Example 10.

Results are shown in Table 1.

Examples 17-20 demonstrate block copolymer with talc above about 5.5 volume percent significantly increase storage modulus and maintain CTE while maintaining adequate elongation to break.

Example 17

18.1 vol % Talc (30 wt %) Filled block copolymer of PMDA//ODA/PPD 100//70/30.

A 186.87 g portion of the prepolymer prepared in Comparative

Example 14 was blended with 13.13 g of SF-310 talc (Lot M685, Kish Co., Mentor, Ohio) in a similar manner to Comparative Example 11. This filler containing PAA solution was finished similarly as in Comparative Example 10 to yield a viscosity of ca. 2000 poise. The solution was pressured filtered through a 45 micron polypropylene screen and degassed under vacuum to remove air bubbles. A film was cast and cured similarly Comparative Example 10. Filler loading was approximately 30 wt % in the polyimide film. A 2.6 mil (66 micron) film was produced.

CTE, E' and % elongation at break were measured as in Comparative Example 10.

Results are shown in Table 1.

Example 18

18.1 vol % Talc (30 wt %) Filled block copolymer of PMDA//ODA/PPD 100//70/30.

In a similar manner to Comparative Example 11, a 186.87 g portion of the prepolymer from Comparative Example 14 was blended with 13.13 g of Flextalc 610 (Lot M1085, Kish Co., Mentor, Ohio). Finishing, filtration, casting and curing was similar to as described in Comparative Example 10. Filler loading was approximately 30 wt % in the polyimide film. A 2.9 mil (74 micron) film was produced.

CTE, E' and % elongation at break were measured as in Comparative Example 10.

Results are shown in Table 1.

Example 19

25.6 vol % Talc (40 wt %) Filled block copolymer of PMDA//ODA/PPD 100//70/30.

In a similar manner to Comparative Example 15, the PMDA//ODA/PPD 100//70/30 block prepolymer was blended with SF310 talc to achieve about a 40 wt % loading in the PI film. Finishing, filtration, casting and curing was similar to as described in Comparative Example 10. A 1.8 mil (46 micron) film was produced.

CTE, E' and % elongation at break were measured as in Comparative Example 10.

Results are shown in Table 1.

Example 20

34 vol % Talc (50 wt %) Filled block copolymer of PMDA//ODA/PPD 100//70/30.

In a similar manner to Comparative Example 14, a block prepolymer was prepared with a 70/30 ratio of ODA to PPD. Then in a similar manner to Comparative Example 11, a 171.75 g portion of this prepolymer was blended with 28.255 g SF310 talc to achieve about a 50 wt % loading in the PI film. Finishing, filtration, casting and curing was similar to as described in Comparative Example 10. A 1.5 mil (38 micron) film was produced.

CTE, E' and % elongation at break were measured as in Comparative Example 10.

Results are shown in Table 1.

Comparative Example 15

5.4 vol % Talc (10 wt %) Filled block copolymer of PMDA//ODA/PPD 100//70/30.

Comparative Example 15 demonstrates talc below about 5.5 volume percent does not significantly increase storage modulus.

In a similar manner to Comparative Example 14, a block prepolymer was prepared with a 70/30 ratio of ODA to PPD. Then in a similar manner to Comparative Example 11, a 187.16 g portion of this prepolymer was blended with 3.48 g SF310 talc to achieve about a 10 wt % loading in the PI film. Finishing, filtration, casting and curing was similar to as described in Comparative Example 10. A 1.7 mil (43 micron) film was produced.

CTE, E' and % elongation at break were measured as in Comparative Example 10.

Results are shown in Table 1.

Examples 21-24 illustrate the ability to include additional co-monomers in the compositions of the present invention and still achieve desirable properties.

Example 21

18.1 vol % (30 wt %) Talc Filled block copolymer of PMDA/BPDA//ODA/PPD 95/5//70/30

In a similar manner to Comparative Example 14, a prepolymer was produced from 14.988 g PPD and 28.720 g PMDA in 393.4 g DMAC, followed by dilution with 386.8 g DMAC, then addition of 64.758 g ODA, and then 6.796 g of BPDA (which was allowed to dissolve/react), then 64.998 g of PMDA, followed by 41.0 g DMAC. A 186.8 g portion of this prepolymer was blended with 13.17 g SF310 talc (Lot M685, Kish Co., Mentor, Ohio) similar to Comparative Example 11, finished as in Comparative Example 10, filtered, and then a film was cast and cured similarly to Comparative Example 10. A 2.0 mil (51 micron) film was produced.

CTE, E' and % elongation at break were measured as in Comparative Example 10.

Results are shown in Table 1.

Example 22

12.6 vol % (30 wt %) Acicular $TiO_2$ Filled block copolymer of PMDA/BPDA//ODA/PPD 95/5//70/30

In a similar manner to Example 21, a 172.7 g portion of the prepolymer from Example 21 was blended with a 27.3 g portion of the $TiO_2$ slurry as described in Example 16. Finishing, filtration, casting and curing was similar to as described in Comparative Example 10. Filler loading was approximately 30 wt % in the polyimide film. A 2.2 mil (56 micron) film was produced.

CTE, E' and % elongation at break were measured as in Comparative Example 10.

Results are shown in Table 1.

Example 23

18.1 vol % (30 wt %) Talc Filled block copolymer of PMDA/BPDA//ODA/PPD 75/25//70/30

In a similar manner to Comparative Example 14, a prepolymer was produced from 14.407 g PPD and 27.607 g PMDA in 378.1 g DMAC, followed by dilution with 401 g DMAC, then addition of 62.249 g ODA, and then 32.666 g of BPDA (which was allowed to dissolve/react), then 43.106 g of PMDA, followed by 41.0 g DMAC. A 186.8 g portion of this prepolymer was blended with 13.17 g SF310 talc (Lot M685, Kish Co., Mentor, Ohio) similar to Comparative Example 11, finished, cast and cured similarly to Comparative Example 10. A 1.7 mil (43 micron) film was produced.

CTE, E' and % elongation at break were measured as in Comparative Example 10.

Results are shown in Table 1.

Example 24

12.6 vol % (30 wt %) Acicular $TiO_2$ Filled block copolymer of PMDA/BPDA//ODA/PPD 75/25//70/30

In a similar manner to Example 23, a 172.7 g portion of the prepolymer from Example 23 was blended with a 27.3 g portion of the $TiO_2$ slurry as described in Example 16. Finishing, filtration, casting and curing was similar to as described in Comparative Example 10. A 2.3 mil (58 micron) film was produced.

CTE, E' and % elongation at break were measured as in Comparative Example 10.

Results are shown in Table 1.

The following Examples demonstrate the impact on properties of a particulate (less than 3:1 aspect ratio) vs. a high aspect ratio (greater than 3:1 aspect ratio) platelet filler on the properties of a polyimide film. The platelet filler results in advantageously higher modulus and lower CTE at equivalent weight loadings. (Note that although the average particle sizes of these two fillers appear significantly different (platelet is significantly larger) via particle size analysis (Horiba LA-930 particle size analyzer), it is believed that the effect on properties is largely due to the filler shape, rather than any differences in average particle size).

Comparative Example 16

(40 wt %) less than 3:1 aspect ratio $Al_2O_3$ (particulate) in PMDA//ODA

A portion of a polyamic acid prepolymer of PMDA and ODA (prepared in DMAC at about 20.6%, approximately 50 poise viscosity) was blended with particulate alumina filler (Martoxid MZS-1, Albermarle Corporation) in a Silverson (model L4RT-A) high shear mixer. The amount of alumina was chosen so as to ultimately yield a final polyimide film with a 40 wt % loading of alumina in polyimide. The polyamic acid was then further reacted ("finished") to a viscosity of about 537 poise (Brookfield DV-II+ viscometer with a #LV5 spindle) by stepwise additions of a 6 wt % PMDA solution in DMAC with thorough mixing via a high torque mechanical mixer/stir blade. The polymer was subsequently cast onto a glass plate and heated to about 80° C. until a tack free film was obtained. The film was carefully peeled from the glass and placed on a pin frame and placed in a circulating air oven and the temperature slowly ramped to 320° C. and held there for 30 minute. Next, the film was removed from the 320° C. oven and place in a 400° C. air oven for 5 minutes. Afterwards, the polyimide film on the pin frame was removed from the oven and allowed to cool to room temperature. The film was then separated from the pin frame.

E' was measured as in Comparative Example 10. CTE was measured on the same instrument and at the same rate as Comparative Example 10 except that the sample was heated to 380° C., then cooled and reheated to 380° C.) and evaluated between 50-350° C. on the reheat.

Results are shown in Table 1.

Example 25

(40 wt %) greater than 3:1 aspect ratio $Al_2O_3$ (platy) in PMDA//ODA.

In a similar manner to Comparative Example 16, a portion of the PMDA//ODA prepolymer was blended with a platelet-shaped alumina ("Platyl" from Advanced Nanotechnology Limited, Australia) at the same loading level as the particular alumina from Comparative Example 16 and finished to a Brookfield viscosity of 502 poise). This filled polymer solution was cast and thermally cured as in Comparative Example 16.

E' was measured as in Comparative Example 10. CTE was measured on the same instrument and at the same rate as Comparative Example 16.

Results are shown in Table 1.

Note that not all of the activities described above in the general description or the Examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and any figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

When an amount, concentration, or other value or parameter is given as either a range, preferred range or a list of upper values and lower values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

TABLE 1

| | POLYMER (ODA/PPD ratio) | Filler | wt % | Equivalent vol %, using density of 1.42 g/c for polymer, 4.2 g/cc for acicular $TiO_2$, 2.75 g/cc for talc, 3.22 g/cc for SiC | E' at 50° C. (unless otherwise noted) GPa | E' at 300° C. GPa | E' at 480° C. GPa | CTE MD, ppm/C | CTE TD, pp/C | % TENSILE ELONGATION to Break MD/TD |
|---|---|---|---|---|---|---|---|---|---|---|
| 1 | PMDA/ODA | Acicular $TiO_2$ | 34.3 | 15.00 | 5.7 (25° C.) | 3.2 | 0.854 (500° C.) | 24.0 | 26.4 | 35.6 MD |
| 2 | PMDA/ODA | Acicular $TiO_2$ | 24.7 | 10.00 | 6.2 (25° C.) | 3.5 | 0.875 (500° C.) | 24.6 | 32.4 | |
| 3 | PMDA/ODA | Acicular $TiO_2$ | 42.5 | 20.00 | 6.14 (25° C.) | 3.6 | 1.02 (500° C.) | 27.1 | 17.4 | |
| 4 | PMDA/ODA | SiC fiber | 20.1 | 10.00 | 5.3 (25° C.) | 2.7 | 0.27 (500° C.) | 22.0 | 31.2 | 35.8 MD |
| Comp. 1 | PMDA/ODA | None | 0 | 0.00 | 3.5 (25° C.) | 1.8 | 0.4 (500° C.) | 38.4 | 39.6 | |
| Comp. 2 | PMDA/ODA | acicular $TiO_2$ | 7 | 2.50 | 3.9 (25° C.) | 2.1 | 0.51 (500° C.) | 38.0 | 38.6 | |

TABLE 1-continued

| | POLYMER (ODA/PPD ratio) | Filler | wt % | Equivalent vol %, using density of 1.42 g/c for polymer, 4.2 g/cc for acicular TiO$_2$, 2.75 g/cc for talc, 3.22 g/cc for SiC | E' at 50° C. (unless otherwise noted) GPa | E' at 300° C. GPa | E' at 480° C. GPa | CTE MD, ppm/C | CTE TD, pp/C | % TENSILE ELONGATION to Break MD/TD |
|---|---|---|---|---|---|---|---|---|---|---|
| Comp. 3 | PMDA/ODA | acicular TiO$_2$ | 13.5 | 5.00 | 4.4 (25° C.) | 2.3 | 0.55 (500° C.) | 31.0 | 36.8 | |
| Comp. 4 | PMDA/ODA | acicular TiO$_2$ | 17.1 | 6.50 | 4.4 (25° C.) | 2.4 | 0.61 (500° C.) | 30.0 | 33.8 | |
| Comp. 5 | PMDA/ODA | acicular TiO$_2$ | 21.6 | 8.50 | 4.3 (25° C.) | 2.2 | 0.51 (500° C.) | 32.9 | 34.1 | |
| Comp 6 | PMDA/ODA | Spherical TiO$_2$ | 34.3 | 15.00 | 4.42 (25° C.) | 2.2 | 0.48 (500° C.) | 37.7 | 43.5 | |
| Comp. 7 | BPDA/PPD | None | 0 | 0.00 | | | | 10.6 | | |
| Comp. 8 | BPDA/PPD | acicular TiO$_2$ | 33.7 | 14.64 | | | | 23.0 | | |
| Comp. 9 | BPDA/PPD all rigid rod | acicular TiO$_2$ | 33.7 | 14.64 | | | | | | 6 |
| Comp. 10 | PMDA/ODA | None | 0 | 0.00 | 2.9 | | 0.29 | 43.0 | 42.0 | |
| Comp. 11 | PMDA/ODA | Talc | 10 | 5.42 | 3.0 | | 0.21 | 29.0 | 23.0 | 126/136 |
| 5 | PMDA/ODA | Talc | 24 | 14.02 | 5.7 (25° C.) | | | 25.4 | | |
| 6 | PMDA/ODA | Talc | 30 | 18.08 | 5.8 | | 0.78 | 24.0 | 23.0 | 178/181 |
| 7 | PMDA/ODA | Talc | 30 | 18.08 | 5.4 | | 0.86 | 21.0 | 19.0 | 171/148 |
| 8 | PMDA/ODA | Talc | 50 | 34.00 | 8.9 | | 1.20 | 11.0 | 13.0 | 56/3 |
| 9 | PMDA/ODA | Talc | 60 | 43.60 | 11.1 | | 1.96 | 8.0 | 9.0 | 42/56 |
| 10 | PMDA//ODA/PPD Random (70/30) | Talc | 30 | 18.08 | 7.1 | | 1.17 | 13.0 | 17.0 | 63/41 |
| 11 | PMDA//ODA/PPD Random (70/30) | acicular TiO$_2$ | 30 | 12.64 | 6.3 | | 0.87 | 18.0 | 25.0 | 27/45 |
| Comp. 12 | PMDA//ODA/PPD Random (70/30) | None | 0 | 0.00 | 4.5 | | 0.45 | 23.0 | 25.0 | 122/123 |
| 12 | PMDA/ODA | Talc 10 wt % TiO$_2$ 20 wt % | | | 7.3 | | 0.94 | 21.0 | 293.0 | 69/72 |
| 13 | PMDA/ODA | Talc 20 wt % TiO$_2$ 10 wt % | | | 5.9 | | 0.94 | 19.0 | 21.0 | 76/78 |
| 14 | PMDA//ODA/PPD 80/20 | acicular TiO$_2$ | 28.23 | 11.74 | 6.8 (25° C.) | 4.0 | 1.5 (500° C.) | 23.0 | 21.0 | |
| 15 | PMDA//ODA/PPD 80/20 | acicular TiO$_2$ | 38.5 | 17.50 | 7.1 (25° C.) | 4.1 | 1.3 (500° C.) | 20.0 | 17.5 | |
| Comp. 13 | PMDA//ODA/PPD 80/20 | None | 0 | 0.00 | 3.5 | 2.0 | 1.2 (500° C.) | 23.0 | 24.0 | |
| 16 | PMDA//ODA/PPD 70/30 | acicular TiO$_2$ | 30 | 12.64 | 7.5 | | 1.22 | 15.0 | 14.0 | 41/53 |
| Comp. 14 | PMDA//ODA/PPD 70/30 | None | 0 | 0.00 | 5.2 | | 0.70 | 7.0 | 9.0 | 107/124 |
| 17 | PMDA//ODA/PPD 70/30 | Talc | 30 | 18.08 | 6.9 | | 1.24 | 9.0 | 9.0 | 84/69 |
| 18 | PMDA//ODA/PPD 70/30 | Talc | 30 | 18.08 | 7.4 | | 1.34 | 8.0 | 13.0 | 62/54 |
| 19 | PMDA//ODA/PPD 70/30 | Talc | 40 | 25.62 | 9.5 | | 1.80 | 10.0 | 9.0 | 58/52 |
| 20 | PMDA//ODA/PPD 70/30 | Talc | 50 | 34.00 | 11.1 | | 2.60 | 8.0 | 7.0 | 31/41 |
| Comp. 15 | PMDA//ODA/PPD 70/30 | Talc | 10 | 5.42 | 5.4 | | 0.72 | 9.0 | 4.0 | 60/66 |
| 21 | PMDA/BPDA//ODA/PPD 95/5//70/30 | Talc | 30 | 18.08 | 9.7 (25° C.) | | 1.42 (498° C.) | 6.0 | 10.0 | 60/80 |
| 22 | PMDA/BPDA//ODA/PPD 95/5//70/30 | acicular TiO$_2$ | 30 | 12.64 | 8.3 (25° C.) | | 1.26 (498° C.) | 11.0 | 17.0 | 40/56 |
| 23 | PMDA/BPDA//ODA/PPD 75/25//70/30 | Talc | 30 | 18.08 | 10.9 (25° C.) | | 0.88 (498° C.) | 8.0 | 11.0 | 51/38 |
| 24 | PMDA/BPDA//ODA/PPD 75/25//70/30 | acicular TiO$_2$ | 30 | 12.64 | 9 (25° C.) | | 0.61 (498° C.) | 11.0 | 20.0 | 32/68 |
| Comp. 16 | PMDA/ODA | particle Al$_2$O$_3$ | 40 | | 4.1 | | 0.28 | 52.0 | | |
| 25 | PMDA/ODA | platy Al$_2$O$_3$ | 40 | | 6.6 | | 1.10 | 20.0 | | |

What is claimed is:

1. A thin film transistor composition comprising:
   A) a semiconductor material;
   B) a substrate, having a first surface on the side of the substrate closest to the semiconductor material and a second surface on the other side of the substrate and having a thickness from 5 to 150 microns, the substrate comprising:
   a) a polyimide derived from:
      i) at least one aromatic dianhydride component selected from the group consisting of rigid rod dianhydride, non-rigid rod dianhydride and combinations thereof, and
      ii) at least one aromatic diamine component selected from the group consisting of rigid rod diamine, non-rigid rod diamine and combinations thereof;
      wherein the mole ratio of dianhydride to diamine is 48-52:52-48 and the ratio of X:Y is 20-80:80-20 where X is the mole percent of rigid rod dianhydride and rigid rod diamine, and Y is the mole percent of non-rigid rod dianhydride and non-rigid rod diamine based upon the total dianhydride component and total diamine component of the polyimide; and
   b) a sub-micron filler:
      i) being less than 550 nanometers (as a numerical average) in at least one dimension;
      ii) having an aspect ratio greater than 3:1;
      iii) being less than the thickness of the substrate in all dimensions; and
      iv) being present in an amount from 10 to 45 volume percent of the substrate.

2. The thin film transistor composition in accordance with claim 1, wherein the sub-micron filler is less than 400 nanometers in at least one dimension.

3. The thin film transistor composition in accordance with claim 1, wherein the sub-micron filler is selected from the group consisting of oxides, nitrides, carbides and combinations thereof.

4. The thin film transistor composition in accordance with claim 1, wherein the sub-micron filler is acicular titanium dioxide, talc, SiC fiber, platy $Al_2O_3$ or mixtures thereof.

5. The thin film transistor composition in accordance with claim 1, wherein the polyimide is derived from:
   a) at least 75 mole percent of the aromatic dianhydride component is pyromellitic dianhydride; and
   b) 70 mole percent 4,4'-diaminodiphenyl ether and 30 mole percent 1,4 diaminobenzene as the aromatic diamine component.

6. The thin film transistor composition in accordance with claim 1, wherein the sub-micron filler is coated with a coupling agent, a dispersant or a combination thereof.

7. The thin film transistor composition in accordance with claim 1 wherein the polyimide is a random copolymer derived from 4,4'-diaminodiphenyl ether and 1,4 diaminobenzene with pyromellitic dianhydride and 3,3',4,4'-biphenyl tetracarboxylic dianhydride.

8. The thin film transistor composition in accordance with claim 1 wherein the polyimide is a random copolymer derived from 4,4'-diaminodiphenyl ether and 1,4 diaminobenzene with pyromellitic dianhydride.

9. The thin film transistor composition in accordance with claim 1, wherein the substrate comprises a metal layer, the metal layer having a thickness less than 50 nanometers and the metal layer being on the side thereof remote from the semiconductor material.

10. The thin film transistor composition in accordance with claim 9, wherein the metal layer has walls defining apertures extending through the metal layer.

11. The thin film transistor composition in accordance with claim 1, wherein:
    a) at least 70 mole percent of the aromatic dianhydride component is pyromellitic dianhydride; and
    b) at least 70 mole percent of the aromatic diamine component is 4,4'-diaminodiphenyl ether.

12. The thin film transistor composition in accordance with claim 11, wherein the sub-micron filler is acicular titanium dioxide, talc, SiC fiber, platy $Al_2O_3$ or mixtures thereof.

13. The thin film transistor composition in accordance with claim 1, wherein the semiconductor material comprises amorphous silicon.

14. The thin film transistor composition in accordance with claim 13, wherein the semiconductor material further comprises a n-type silicon layer on the amorphous silicon.

15. The thin film transistor composition in accordance with claim 14, further comprising a patterned layer of metal located on the n-type silicon layer, wherein the n-type silicon layer defines a complementary pattern to the patterned layer of metal so that the n-type silicon layer is only under the patterned layer of metal.

16. The thin film transistor composition in accordance with claim 1 additionally comprising a passivating layer between the semiconductor material and the first surface.

17. The thin film transistor composition in accordance with claim 16, wherein the passivating layer comprises silicon dioxide or aluminum nitride.

18. The thin film transistor composition in accordance with claim 16, additionally comprising a dielectric layer between the semiconductor material and the passivating layer.

19. The thin film transistor composition in accordance with claim 18, wherein the dielectric layer comprises silicon nitride.

20. The thin film transistor composition in accordance with claim 1 wherein the polyimide is a block copolymer.

21. The thin film transistor composition in accordance with claim 20 wherein the block copolymer is derived from 4,4'-diaminodiphenyl ether and 1,4 diaminobenzene with pyromellitic dianhydride and 3,3',4,4'-biphenyl tetracarboxylic dianhydride.

22. The thin film transistor composition in accordance with claim 20 wherein the block copolymer is derived from:
    a) 10 to 40 mole percent blocks of pyromellitic dianhydride and 1,4 diaminobenzene;
    b) 90 to 60 mole percent blocks of pyromellitic dianhydride and 4,4'-diaminodiphenyl ether.

23. The thin film transistor composition in accordance with claim 22, wherein the sub-micron filler is acicular titanium dioxide, talc, SiC fiber, platy $Al_2O_3$ or mixtures thereof.

* * * * *